(12) United States Patent
Kinugawa

(10) Patent No.: US 9,446,942 B2
(45) Date of Patent: Sep. 20, 2016

(54) ELECTRONIC PART, ELECTRONIC APPARATUS, AND MOVING OBJECT

(71) Applicant: Seiko Epson Corporation, Tokyo (JP)

(72) Inventor: Takuya Kinugawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/722,417

(22) Filed: May 27, 2015

(65) Prior Publication Data
US 2015/0344301 A1 Dec. 3, 2015

(30) Foreign Application Priority Data
Jun. 2, 2014 (JP) ................................. 2014-114341

(51) Int. Cl.
*B81B 7/00* (2006.01)
(52) U.S. Cl.
CPC ...... *B81B 7/0064* (2013.01); *B81B 2201/0264* (2013.01); *B81C 2203/0136* (2013.01)
(58) Field of Classification Search
CPC ................. B81B 7/0064; B81B 2201/0264; B81C 2203/0136
See application file for complete search history.

(56) References Cited

U.S. PATENT DOCUMENTS

| | | | |
|---|---|---|---|
| 2006/0205106 A1* | 9/2006 | Fukuda | B81C 1/00246 438/52 |
| 2008/0105951 A1* | 5/2008 | Sato | B81C 1/00246 257/619 |
| 2008/0224241 A1* | 9/2008 | Inaba | B81B 3/0075 257/415 |
| 2011/0126632 A1* | 6/2011 | McNeil | B81B 7/02 73/718 |
| 2011/0241136 A1* | 10/2011 | Inaba | B81B 3/0081 257/415 |
| 2012/0104593 A1* | 5/2012 | Kanemoto | B81C 1/00333 257/729 |

FOREIGN PATENT DOCUMENTS

| | | |
|---|---|---|
| JP | 2008-221435 A | 9/2008 |
| JP | 2009-105411 A | 5/2009 |

* cited by examiner

*Primary Examiner* — Minh-Loan Tran
*Assistant Examiner* — Farid Khan
(74) *Attorney, Agent, or Firm* — Harness, Dickey & Pierce, P.L.C.

(57) ABSTRACT

An electronic part includes a bottom portion of a cavity that has an oscillation device, a ceiling portion so disposed that it faces the bottom portion via the cavity and having holes, a shielding portion that is disposed in the cavity and between the bottom portion of the cavity and the ceiling portion and covers the holes in a plan view viewed in the direction in which the bottom portion of the cavity and the ceiling portion are arranged, and sealing portions that are connected to both the ceiling portion and the shielding portion via the holes and seal the holes.

13 Claims, 16 Drawing Sheets

ELECTRONIC PART, ELECTRONIC APPARATUS, AND MOVING OBJECT

BACKGROUND

1. Technical Field

The present invention relates to an electronic part, an electronic apparatus, and a moving object.

2. Related Art

There is a known electronic part having a cavity formed by using a semiconductor manufacturing process (see JP-A-2009-105411, for example).

For example, the electronic part described in JP-A-2009-105411 includes a substrate, a functional structural body that forms a functional device having a movable portion formed on the substrate, and a coated structure that defines a cavity in which the functional structural body is disposed. The coated structure includes a laminated structure of an interlayer insulating film and a wiring layer so formed on the substrate that the laminated structure surrounds the cavity. An upper coating portion that forms the coated structure and covers the cavity from above has a first coating layer having through holes facing the cavity and a second coating layer that blocks the through holes in the first coating layer, and the first coating layer is part of the wiring layer.

JP-A-2009-105411 further discloses a configuration in which a third coating layer is provided between the functional structural body and the first coating layer with the third coating layer covering the through holes in the first coating layer in a plan view and having through holes covered with the first coating layer in the plan view. The configuration described above can, for example, prevent the material of the second coating layer from attaching to the functional structural body even when the second coating layer is formed by using a vapor phase epitaxy method.

A method for manufacturing the electronic part includes a structural body formation step of forming the functional structural body along with a sacrifice layer, an insulating film formation step of forming the interlayer insulating film on the functional structural body, a wiring formation step of forming the wiring layer on the interlayer insulating film in such a way that the first coating layer, which has the through holes and covers the functional structural body from above, is formed of part of the wiring layer, a release step of removing the interlayer insulating film and the sacrifice layer on the functional structural body through the through holes in the first coating layer, and a coating step of forming the second coating layer, which blocks the through holes in the first coating layer.

The electronic part described in JP-A-2009-105411, however, has the following problem: In the coating step, since the through holes in the first coating layer need to be blocked by depositing the material of which the second coating layer is made on the side surface of each of the through holes in the first coating layer by using a vapor phase film deposition method, the through holes in the first coating layer need to have a small width. As a result, in the release step, an etchant is not readily introduced or removed, resulting in a decrease in productivity.

SUMMARY

An advantage of some aspects of the invention is to provide an electronic part that allows improvement in productivity and has excellent characteristics and further provide an electronic apparatus and a moving object including the electronic part.

The invention can be implemented as the following application examples.

APPLICATION EXAMPLE 1

An electronic part according to this application example of the invention includes a bottom portion that has a functional portion, a ceiling portion that is disposed in a position separate from the bottom portion via a cavity and has holes, a shielding portion that is disposed between the bottom portion and the ceiling portion in the cavity and covers the holes in a plan view viewed in a direction in which the bottom portion and the ceiling portion are arranged, and sealing portions that are connected to both the ceiling portion and the shielding portion and seal the holes.

According to the electronic part described above, since the sealing portions are connected to both the ceiling portion and the shielding portion via the holes in the ceiling portion so that the sealing portions seal the holes in the ceiling portion, the width of each of the holes in the ceiling portion can be increased. As a result, at the time of manufacture of the electronic part, when wet etching is performed through the holes in the ceiling portion, an etchant can be readily introduced and removed, resulting in improvement in the productivity.

Further, since the shielding portion covers the holes in the ceiling portion in the plan view, when a sealing layer is formed by using a vapor phase film deposition method, the amount of attachment of the material of which the sealing layer is made to the functional portion can be reduced. An unwanted change in a characteristic of the functional portion can therefore be suppressed, resulting in an excellent characteristic thereof.

APPLICATION EXAMPLE 2

It is preferable that the electronic part according to the application example of the invention further includes a shielding layer having the shielding portion and openings, and the openings are preferably disposed in positions shifted from the holes in the plan view.

With this configuration, when the sealing layer is formed by using a vapor phase film deposition method, the amount of attachment of the material of which the sealing layer is made to the functional portion can be effectively reduced.

APPLICATION EXAMPLE 3

In the electronic part according to the application example of the invention, it is preferable that the ratio of the area occupied by all the openings to the area of the shielding layer in the cavity in the plan view is greater than or equal to 20% but smaller than or equal to 80%.

The thus set ratio allows an etchant to be readily introduced and removed when wet etching is performed through the holes in the ceiling portion, and the amount of attachment of the material of which the sealing layer is made to the functional portion can be effectively reduced.

APPLICATION EXAMPLE 4

In the electronic part according to the application example of the invention, it is preferable that the openings include an opening that coincides with a central portion of the bottom portion in the plan view.

With this configuration, even when the shielding layer is bent along with the ceiling portion toward the bottom portion, the shielding layer (shielding portion) will not come into contact with the functional portion. An unwanted change in the characteristic of the functional portion can therefore be suppressed.

APPLICATION EXAMPLE 5

In the electronic part according to the application example of the invention, it is preferable that the ratio of the area occupied by the opening that coincides with the central portion to the area of the shielding layer in the cavity in the plan view is greater than or equal to 10% but smaller than or equal to 40%.

The thus set ratio can ensure a necessary area of the shielding portion and prevent the shielding layer (shielding portion) from coming into contact with the functional portion even when the shielding layer is bent along with the ceiling portion toward the bottom portion.

APPLICATION EXAMPLE 6

In the electronic part according to the application example of the invention, it is preferable that the functional portion includes a diaphragm that undergoes bending deformation under pressure, and a bending detection device that outputs a signal according to the bending deformation of the diaphragm.

The thus configured electronic part according to the application example of the invention can be used as a pressure sensor. In the pressure sensor, when the material of which the sealing layer is made attaches to the diaphragm and the bending detection device, an unwanted change in the characteristic of the electronic part tends to occur. Therefore, when the invention is applied to the pressure sensor, the advantageous effect provided by the invention appears in a remarkable manner. Further, in the electronic part, when the shielding layer is bent along with the ceiling portion toward the bottom portion and comes into contact with the diaphragm, an unwanted change in the characteristic also tends to occur. Therefore, in the pressure sensor, preventing the shielding layer (shielding portion) from coming into contact with the functional portion allows the advantageous effect to appear in a remarkable manner.

APPLICATION EXAMPLE 7

In the electronic part according to the application example of the invention, it is preferable that the functional portion includes a resonator.

The electronic part according to the application example of the invention can therefore be used in an oscillator, a vibrator, an acceleration sensor, an angular velocity sensor, a pressure sensor, and other types of sensor. In the electronic part including a resonator, when the material of which the sealing layer is made attaches to the resonator, an unwanted change in the characteristic of the resonator tends to occur. In the electronic part to which the invention is applied, the advantageous effect provided by the invention therefore appears in a remarkable manner. Further, in the electronic part including a resonator, an unwanted change in the characteristic tends to occur also when the shielding layer is bent along with the ceiling portion toward the bottom portion and comes into contact with the resonator. Therefore, in the electronic part, preventing the shielding layer (shielding portion) from coming into contact with the functional portion allows the advantageous effect provided by the invention to appear in a remarkable manner.

APPLICATION EXAMPLE 8

In the electronic part according to the application example of the invention, it is preferable that the distance between the shielding portion and the ceiling portion is smaller than the distance between the shielding portion and the bottom portion.

The relationship between the distances described above allows the sealing portions to be readily formed, and the large distance between the functional portion and the shielding portion prevents the shielding portion from coming into contact with the functional portion.

APPLICATION EXAMPLE 9

In the electronic part according to the application example of the invention, it is preferable that the distance between the shielding portion and the ceiling portion is greater than the distance between the shielding portion and the bottom portion.

The large gap formed between the shielding portion and the ceiling portion allows an etchant to be readily introduced and removed when wet etching is performed through the holes in the ceiling portion while the height of the electronic part is lowered at the same time.

APPLICATION EXAMPLE 10

It is preferable that the electronic part according to the application example of the invention further includes a sealing layer having the sealing portions, and the thickness of the sealing layer is preferably greater than or equal to the distance between the shielding portion and the ceiling portion.

The thus set thickness allows the sealing layer to seal the holes in the ceiling portion by using a simple method in which the sealing layer having the sealing portions is formed by using a vapor phase film deposition method.

APPLICATION EXAMPLE 11

In the electronic part according to the application example of the invention, it is preferable that the distance between the shielding portion and the ceiling portion falls within a range greater than or equal to 1 µm but smaller than or equal to 5 µm.

The thus set distance allows the sealing layer to seal the holes in the ceiling portion by using a simple method in which the sealing layer having the sealing portions is formed by using a vapor phase film deposition method.

APPLICATION EXAMPLE 12

An electronic apparatus according to this application example of the invention includes the electronic part according to the application example of the invention.

An electronic apparatus including the electronic part that allows improvement in productivity and has excellent characteristics can thus be provided.

APPLICATION EXAMPLE 13

A moving object according to this application example of the invention includes the electronic part according to the application example of the invention.

A moving object including the electronic part that allows improvement in productivity and has excellent characteristics can thus be provided.

BRIEF DESCRIPTION OF THE DRAWINGS

The invention will be described with reference to the accompanying drawings, wherein like numbers reference like elements.

FIG. 2A is a cross-sectional view, and FIG. 2B is a plan view.

FIG. 9A is a cross-sectional view, and FIG. 9B is a plan view.

FIG. 12A is a cross-sectional view showing the state of a diaphragm, and FIG. 12B is a plan view showing the state of the bending detection device.

DESCRIPTION OF EXEMPLARY EMBODIMENTS

An electronic part, an electronic apparatus, and a moving object according to embodiments of the invention will be described below in detail with reference to the accompanying drawings.

First Embodiment

1. Electronic Part

Figure 1:
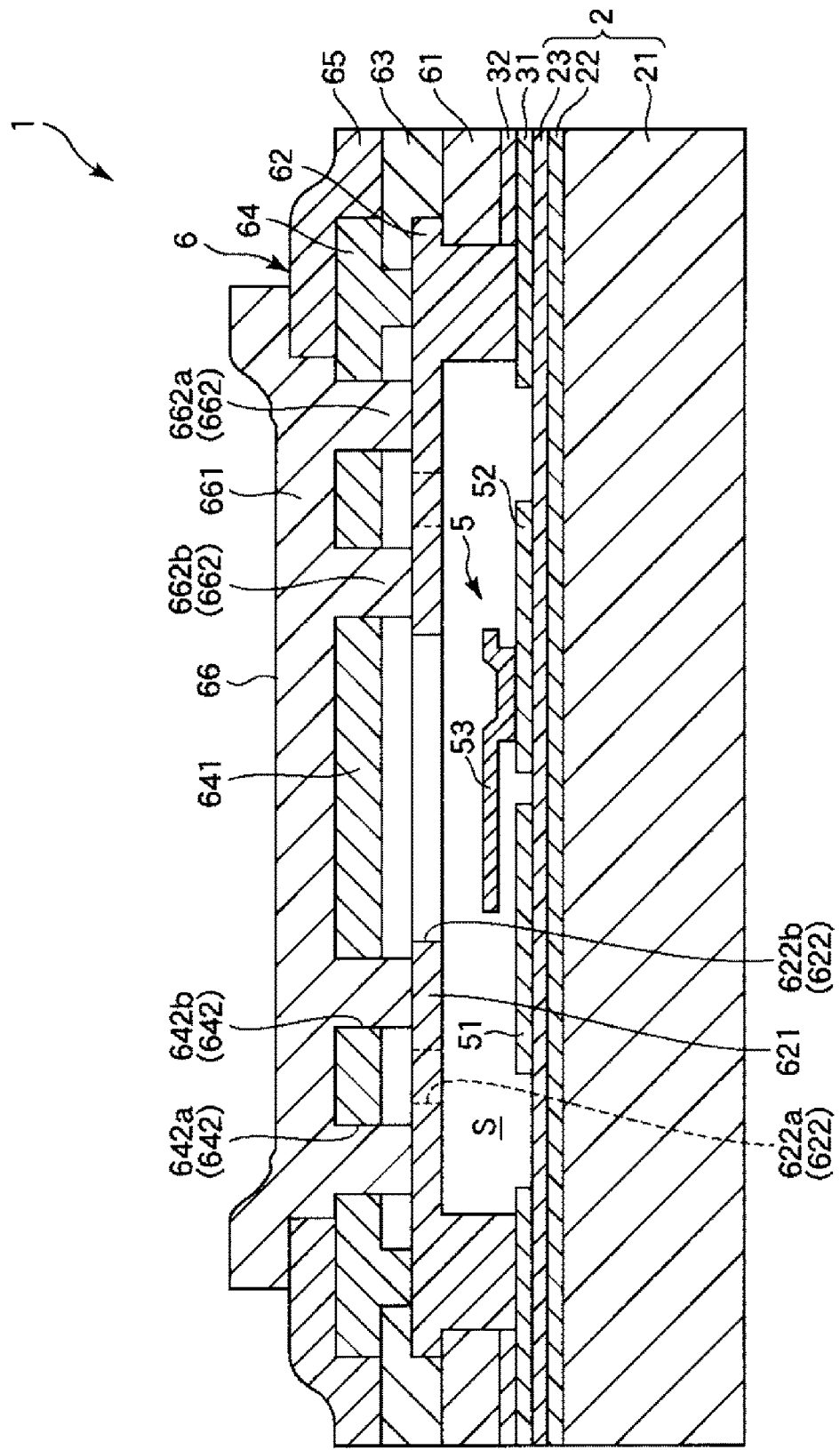
FIG. 1 is a cross-sectional view showing an electronic part according to a first embodiment of the invention.
Figure 2A:
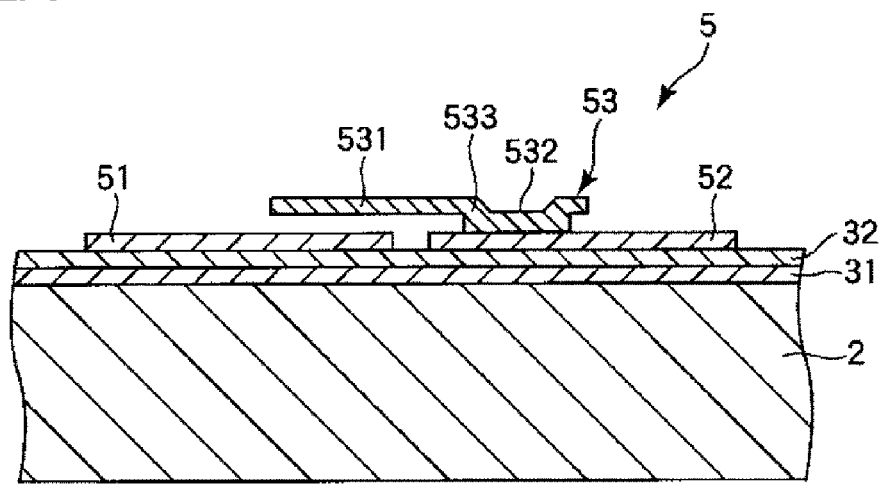
FIGS. 2A and 2B show an oscillation device (functional portion) provided in the electronic part shown in FIG. 1.
Figure 2B:
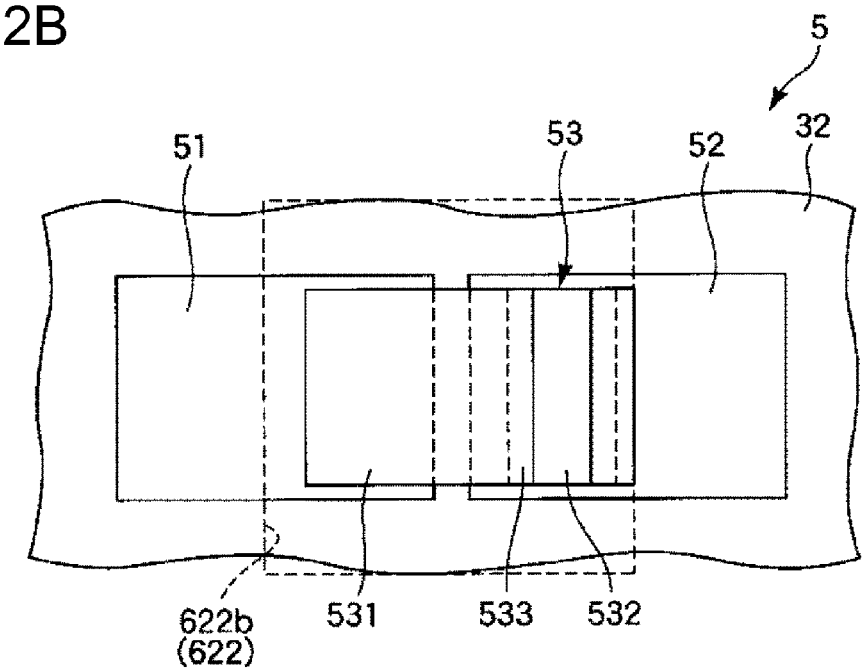
Figure 3A:
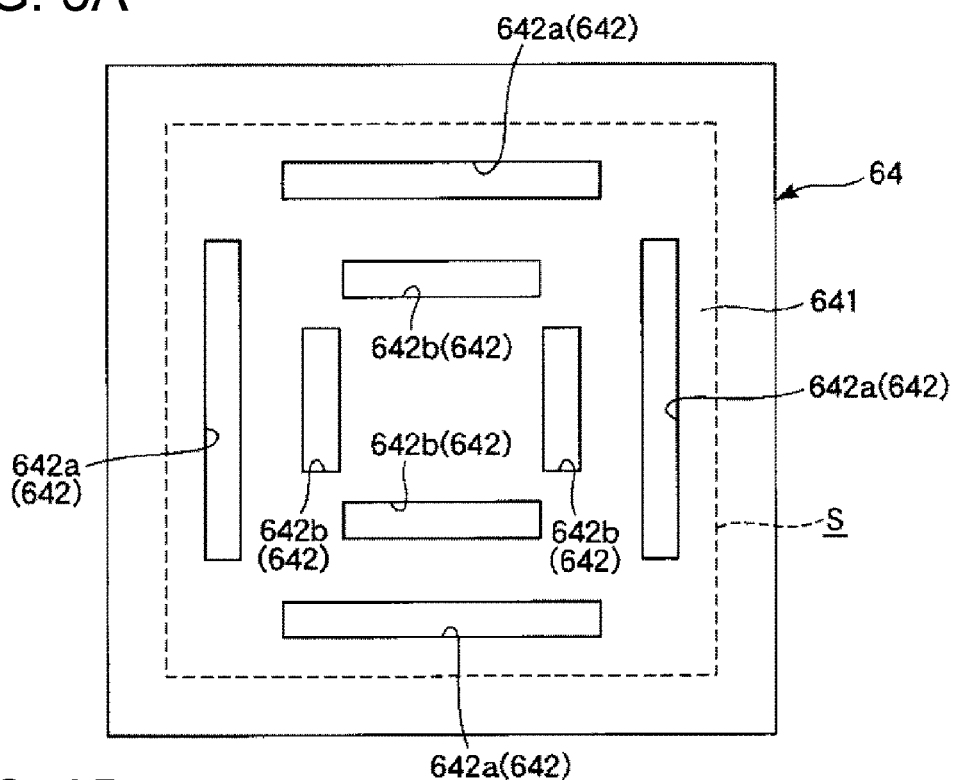
FIG. 3A is a plan view of a ceiling portion provided in the electronic part shown in FIG. 1.
Figure 3B:
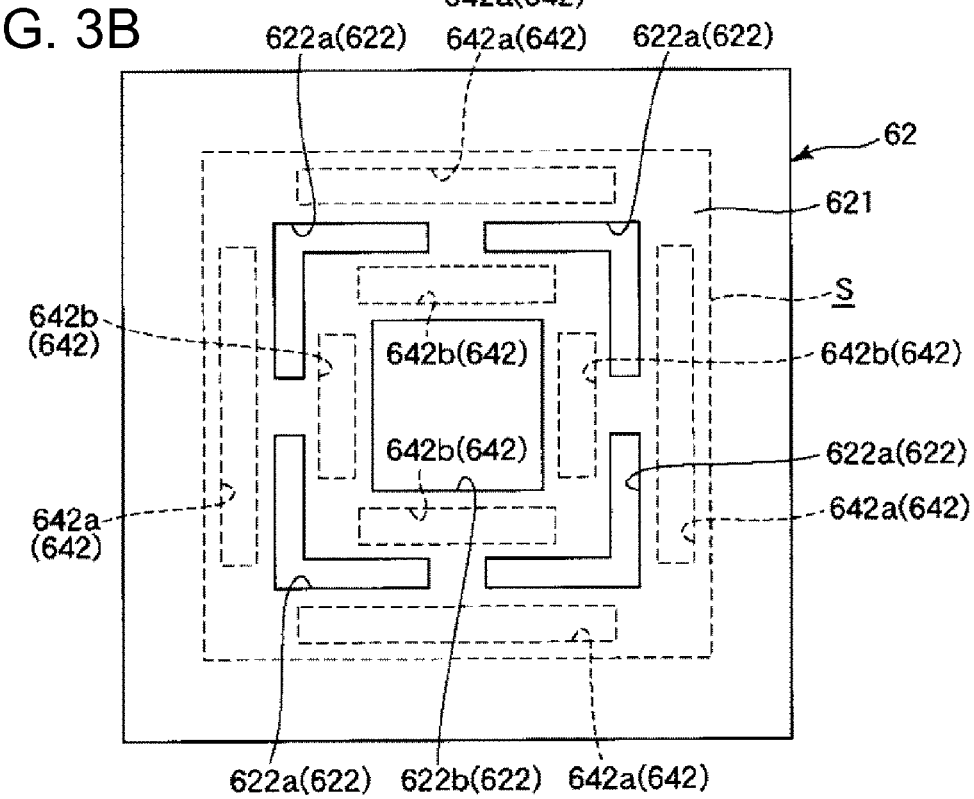
FIG. 3B is a plan view of a shielding portion provided in the electronic part shown in FIG. 1.
Figure 4:
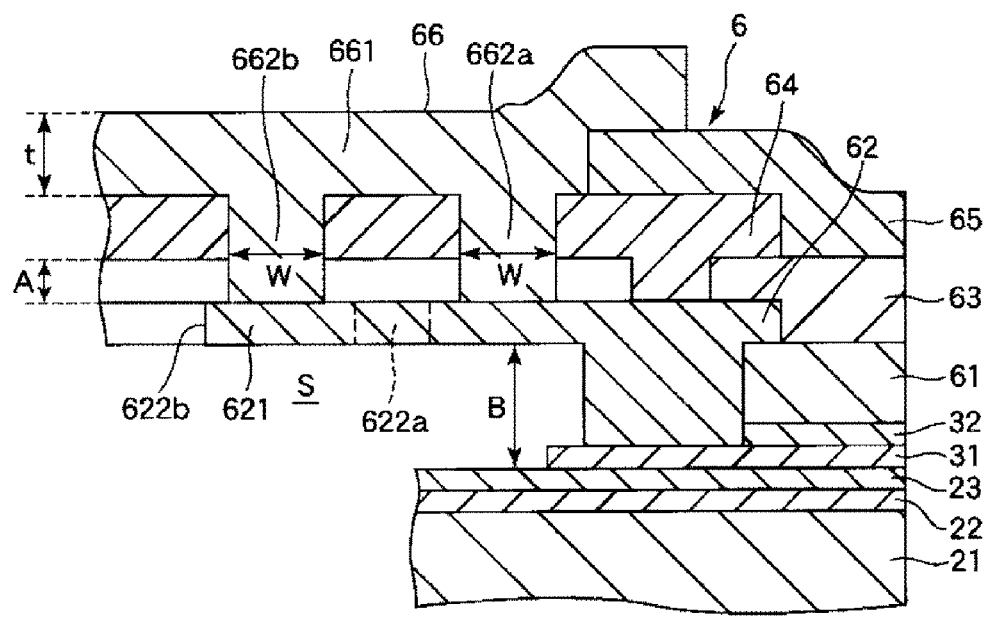
FIG. 4 is a partially enlarged cross-sectional view for describing sealing portions provided in the electronic part shown in FIG. 1.

FIG. 1 is a cross-sectional view showing an electronic part according to a first embodiment of the invention. FIGS. 2A and 2B show an oscillation device (functional portion) provided in the electronic part shown in FIG. 1. FIG. 2A is a cross-sectional view, and FIG. 2B is a plan view. FIG. 3A is a plan view of a ceiling portion provided in the electronic part shown in FIG. 1, and FIG. 3B is a plan view of a shielding portion provided in the electronic part shown in FIG. 1. FIG. 4 is a partially enlarged cross-sectional view for describing sealing portions provided in the electronic part shown in FIG. 1.

An electronic part 1 shown in FIG. 1 includes a substrate 2 (base), an oscillation device 5 (resonator), which is disposed on the substrate 2, and a laminated structural body 6, which forms a cavity S, which accommodates the oscillation device 5, between the substrate 2 and the laminated structural body 6. In the present embodiment, on the surface of the substrate 2 that faces the oscillation device 5 are disposed a conductor layer 31 as well as the oscillation device 5, and between the substrate 2 and the laminated structural body 6 is disposed an insulating layer 32. The oscillation device 5 forms a "functional portion," and a structural body including a portion of the substrate 2 that faces the cavity S or the portion along with the oscillation device 5 forms a "bottom portion" (hereinafter also referred to as a "bottom portion of cavity S"). Further, the laminated structural body 6 has a "ceiling portion," a "shielding portion," and "sealing portions." The portions described above will be sequentially described below.

Substrate 2

The substrate 2 has a semiconductor substrate 21, an insulating film 22, which is provided on one surface of the semiconductor substrate 21, and an insulating film 23, which is provided on the opposite surface of the insulating film 22 to the semiconductor substrate 21.

The semiconductor substrate 21 is made of silicon or any other semiconductor material. The semiconductor substrate 21 is not limited to a substrate made of a single material, such as a silicon substrate, and may, for example, be a substrate having a laminated structure, such as an SOI substrate.

The insulating film 22 is, for example, a silicon oxide film, which has an insulation property. The insulating film 23 is, for example, a silicon nitride film, which has an insulation property and also has resistance to an etchant containing hydrofluoric acid. In the configuration in which the insulating film 22 (silicon oxide film) is interposed between the semiconductor substrate 21 (silicon substrate) and the insulating film 23 (silicon nitride film), the insulating film 22 can suppress propagation of stress produced when the insulating film 23 is formed into the semiconductor substrate 21. Further, the insulating film 22 can also be used as an interdevice separation film when a semiconductor circuit is formed on and above the semiconductor substrate 21. The insulating films 22 and 23 are not necessarily made of the materials described above, and one of the insulating films 22 and 23 may be omitted as required.

The conductor layer 31 is disposed on the insulating film 23 of the substrate 2 and patterned. The conductor layer 31 is made, for example, of single crystal silicon, polycrystal silicon (polysilicon), or amorphous silicon into which phosphorous, boron, or any other impurity is doped (diffused or implanted), and the conductor layer 31 is therefore electrically conductive. Further, although not shown, the conductor layer 31 is so patterned that it has a first portion that forms wiring lines electrically connected to the oscillation device 5 and a second portion separated and electrically insulated from the first portion.

An insulating film 32 is disposed on the conductor layer 31. The insulating film 32 is, for example, a silicon oxide film. The insulating film 32 may be omitted.

Oscillation Device 5

The oscillation device 5 (functional portion) is a resonator. The oscillation device 5 has a pair of lower electrodes 51 and 52, which are disposed on the insulating film 23 of the substrate 2, and an upper electrode 53, which is supported by the lower electrode 52, as shown in FIGS. 2A and 2B.

The lower electrodes 51 and 52 have each a plate-like or sheet-like shape along the substrate 2 and are so disposed that they are separate from each other. Although not shown, each of the lower electrodes 51 and 52 is electrically connected to a wiring line provided in the conductor layer 31 described above. The lower electrode 51 forms a "fixed electrode." The lower electrode 52 can be omitted. In this case, the upper electrode 53 may be directly fixed to the insulating film 23.

The upper electrode 53 has a movable portion 531, which has a plate-like or sheet-like shape and faces the lower electrode 51 with a gap therebetween, a fixed portion 532, which is fixed to the lower electrode 52, and a connection portion 533, which connects the movable portion 531 and the fixed portion 532 to each other. The upper electrode 53 is electrically connected to the lower electrode 52 described above. The upper electrode 53 forms a "movable electrode."

Each of the thus formed lower electrodes 51 and 52 and the upper electrode 53 is made of single crystal silicon, polycrystal silicon (polysilicon), or amorphous silicon into which phosphorous, boron, or any other impurity is doped (diffused or implanted), and the electrodes are therefore electrically conductive.

Each of the lower electrodes 51 and 52 does not necessarily have a specific film thickness and can have a film thickness, for example, greater than or equal to 0.1 μm but smaller than or equal to 1.0 μm. The upper electrode 53 does not necessarily have a specific film thickness and can have a film thickness, for example, greater than or equal to 0.1 μm but smaller than or equal to 1.0 μm.

Laminated Structural Body 6

The laminated structural body 6 is so formed that it defines the cavity S, which accommodates the oscillation device 5. The laminated structural body 6 has an interlayer insulating film 61, which is so formed on the substrate 2 that the interlayer insulating film 61 surrounds the oscillation device 5 in a plan view, a wiring layer 62, which is formed on the interlayer insulating film 61, an interlayer insulating film 63, which is formed on the wiring layer 62 and the interlayer insulating film 61, a wiring layer 64, which is formed on the interlayer insulating film 63, a surface protection film 65, which is formed on the wiring layer 64 and the interlayer insulating film 63, and a sealing layer 66, which is provided on a ceiling portion 641.

Each of the interlayer insulating films 61 and 63 is, for example, a silicon oxide film. Each of the wiring layers 62 and 64 and the sealing layer 66 is made of aluminum or any other metal. The surface protection film 65 is, for example, a silicon nitride film.

The wiring layer 64 has the ceiling portion 641, which is so disposed that it faces the substrate 2 (bottom portion having functional portion) via the cavity S, and a plurality of holes 642 (open holes) are formed in the ceiling portion 641 and pass therethrough in the thickness direction thereof.

The ceiling portion 641 has a shape that spreads in the cavity S in the direction along the principal surface of the substrate 2. The plurality of holes 642, which are formed through the ceiling portion 641, are formed of four holes 642a, which are provided in correspondence with the four sides of the cavity S, which has a rectangular shape in a plan view, and four holes 642b, which are provided in regions inside the four holes 642a and in correspondence with the four sides of the cavity S, which has a rectangular shape in the plan view, as shown in FIG. 3A. Each of the holes 642a and 642b has a slit-like shape extending along the corresponding side of the cavity S, which has a rectangular shape in the plan view.

The wiring layer 62 has a shielding portion 621, which is disposed in the cavity S between the substrate 2 and the ceiling portion 641, and a plurality of openings 622 are formed in the shielding portion 621 and pass therethrough in the thickness direction thereof. The wiring layer 62 forms a "shielding layer" having the shielding portion 621 and the openings 622.

The shielding portion 621 has a shape that spreads in the cavity S in the direction along the principal surface of the substrate 2. The plurality of openings 622, which are formed in the shielding portion 621, are covered with the ceiling portion 641 in a plan view viewed in the direction in which the substrate 2 and the ceiling portion 641 are arranged (hereinafter simply referred to as "plan view").

The plurality of openings 622 will be more specifically described. The plurality of openings 622 are formed of four openings 622a, which are provided in correspondence with the four corners of the cavity S, which has a rectangular shape in the plan view, and one opening 622b, which is provided in a region inside the four openings 622a in the plan view, as shown in FIG. 3B.

The four openings 622a are provided in correspondence with an annular region between the four holes 642a and the four holes 642b in the ceiling portion 641 described above in the plan view. Further, each of the openings 622a has a slit-like shape having a portion bent in correspondence with the corresponding corner of the cavity S, which has a rectangular shape in the plan view, and the two sides of the cavity S that are adjacent to the corner.

The one opening 622b is provided in correspondence with a region inside the four holes 642b in the ceiling portion 641 described above in the plan view. The opening 622b has a rectangular shape corresponding to the cavity S, which has a rectangular shape in the plan view.

The sealing layer 66 has a coating portion 661, which covers the opposite surface of the ceiling portion 641 to the shielding portion 621, and sealing portions 662 (662a, 662b), which extend from the coating portion 661 through the holes 642 (642a, 642b) in the ceiling portion 641 to the shielding portion 621.

The sealing portions 662 are connected to both the ceiling portion 641 and the shielding portion 621 via the holes 642 so that the sealing portions 662 seal the holes 642. The thus configured sealing portions 662 are formed by deposition of the material of which the sealing layer 66 is made on the shielding portion 621 through the holes 642 by using a vapor phase film deposition method, as will be described later in detail. The sealing can therefore be efficiently performed without reduction in the width of the holes, unlike the method of related art in which the material is deposited on the side surface of each of the holes for the sealing. The width of each of the holes 642 in the ceiling portion 641 can therefore be increased. As a result, at the time of manufacture of the electronic part 1, which will be described later, when wet etching is performed through the holes 642 in the ceiling portion 641, an etchant can be readily introduced and removed, resulting in improvement in the productivity.

Further, since the shielding portion 621 covers the holes 642 in the ceiling portion 641 in the plan view, that is, since the openings 622 in the shielding portion 621 are arranged in positions shifted from the holes 642 in the plan view (do not overlap with the holes 642 in the ceiling portion 641 in the present embodiment), the amount of attachment of the material of which the sealing layer 66 is made to the oscillation device 5 can be reduced when the sealing layer 66 is formed by using a vapor phase film deposition method. An unwanted change in a characteristic of the oscillation device 5 can therefore be suppressed, resulting in an excellent characteristic thereof.

The opening 622b in the shielding portion 621 is provided in a central portion of the bottom portion of the cavity S in the plan view and contains the center of the bottom portion of the cavity S. Since the opening 622b coincides with the central portion of the bottom portion of the cavity S in the plan view as described above, the wiring layer 62 (shielding portion 621) will not come into contact with the oscillation device 5 even when the wiring layer 62 (shielding portion 621) is bent along with the ceiling portion 641 toward the bottom portion. Also in this regard, an unwanted change in a characteristic of the oscillation device 5 can be suppressed.

The ratio of the area occupied by all the openings 622 to the area of the wiring layer 62 in the cavity S in the plan view (opening ratio of the wiring layer 62 in the cavity S) is preferably greater than or equal to 20% but smaller than or equal to 80%, more preferably greater than or equal to 30% but smaller than or equal to 70%. The thus set ratio allows an etchant to be readily introduced and removed when wet etching is performed through the holes 642 in the ceiling portion 641, and the amount of attachment of the material of which the sealing layer 66 is made to the oscillation device 5 can be effectively reduced. In contrast, when the ratio described above is too small, it is difficult to allow an etchant to be efficiently introduced and removed through the openings 622 depending on the distance between the ceiling portion 641 and the shielding portion 621 and other factors. On the other hand, when the ratio described above is too large, the mechanical strength of the shielding portion 621 is insufficient in some cases depending on the thickness, the material, and other factors of the shielding portion 621.

Further, the ratio of the area of the opening 622b (opening that coincides with the central portion of the bottom portion in the plan view) to the area of the wiring layer 62 in the cavity S in the plan view is preferably greater than or equal to 10% but smaller than or equal to 40%, more preferably greater than or equal to 25% but smaller than or equal to 35%. The thus set ratio can ensure a necessary area of the shielding portion 621 and prevent the wiring layer 62 from coming into contact with the oscillation device 5 even when the shielding portion 621 is bent along with the ceiling portion 641 toward the bottom portion of the cavity S. In contrast, when the ratio described above is too small, it is difficult to prevent the wiring layer 62 from coming into contact with the oscillation device 5 depending on the size of the oscillation device 5, the distance between the shielding portion 621 and the bottom portion of the cavity S, the rigidity of the shielding portion 621 and the ceiling portion 641, and other factors. On the other hand, when the ratio described above is too large, the area necessary to ensure the function of the shielding portion 621 described above is insufficient in some cases depending on the shape and other factors of the cavity S.

The distance A between the shielding portion 621 and the ceiling portion 641 may be smaller or greater than the distance B between the shielding portion 621 and the bottom portion of the cavity S. When the distance A between the shielding portion 621 and the ceiling portion 641 is smaller than the distance B between the shielding portion 621 and the bottom portion of the cavity S, the small distance A allows the sealing portions 662 to be readily formed, and the large distance B between the oscillation device 5 and the shielding portion 621 prevents the shielding portion 621 from coming into contact with the oscillation device 5.

On the other hand, when the distance A between the shielding portion 621 and the ceiling portion 641 is greater than the distance B between the shielding portion 621 and the bottom portion of the cavity S, the large gap formed between the shielding portion 621 and the ceiling portion 641 allows an etchant to be readily introduced and removed when wet etching is performed through the holes 642 in the ceiling portion 641 while the height of the electronic part 1 is lowered at the same time. It is noted that FIGS. 1 and 4 show the case where the distance A between the shielding portion 621 and the ceiling portion 641 is smaller than the distance B between the shielding portion 621 and the bottom portion of the cavity S by way of example.

Specifically, the distance A between the shielding portion 621 and the ceiling portion 641 is not limited to a particular value and is preferably greater than or equal to 1 µm but smaller than or equal to 5 µm, more preferably greater than or equal to 2 µm but smaller than or equal to 4 µm. The thus set distance A allows the sealing layer 66 to be readily formed by using a vapor phase film deposition method, whereby the manufacture of the electronic part can be simplified. Further, an etchant is allowed to flow in an excellent manner between the ceiling portion 641 and the shielding portion 621 while the height of the electronic part 1 is lowered at the same time.

The distance B between the shielding portion 621 and the bottom portion of the cavity S is not limited to a particular value and is preferably greater than or equal to 2 µm but smaller than or equal to 10 µm, more preferably greater than or equal to 4 µm but smaller than or equal to 8 µm. The thus set distance B prevents the shielding portion 621 from coming into contact with the oscillation device 5 while allowing the height of the electronic part 1 to be reduced and the manufacture of the electronic part 1 to be simplified at the same time.

The thickness t of the sealing layer 66 is greater than or equal to the distance A between the shielding portion 621 and the ceiling portion 641. The thus set thickness t allows the sealing layer 66 to seal the holes 642 in the ceiling portion 641 by using a simple method in which the sealing layer 66 having the sealing portions 662 is formed by using a vapor phase film deposition method. The thickness t of the sealing layer 66 refers to the thickness of the coating portion 661. Although the coating portion 661 has a uniform thickness in FIGS. 1 and 4, forming the sealing layer 66 in a vapor phase film deposition method causes in some cases formation of a recess in the coating portion 661, specifically, in a portion corresponding to each of the sealing portions 662 (see FIGS. 8A to 8D).

Specifically, the distance A between the shielding portion 621 and the ceiling portion 641 is preferably greater than or equal to 1 µm but smaller than or equal to 5 µm, more preferably greater than or equal to 2 µm but smaller than or equal to 4 µm. The thus set distance A allows the sealing layer 66 to seal the holes 642 in the ceiling portion 641 by using a simple method in which the sealing layer 66 having the sealing portions 662 is formed by using a vapor phase film deposition method.

Further, although the width W of each of the holes 642 in the ceiling portion 641 is not limited to a particular value, from a viewpoint of causing an etchant to be readily introduced and removed, the width W is preferably equal to or greater than the distance A between the shielding portion 621 and the ceiling portion 641 but smaller than or equal to 30 times the distance A, more preferably greater than or equal to twice the distance A but smaller than or equal to 20 times the distance A, further preferably greater than or equal to 3 times the distance A but smaller than or equal to 15 times the distance A. In contrast, when the width W is too small, it is difficult to allow an etchant to be readily introduced and removed through the holes 642. On the other hand, when the width W is too large, the area of the shielding portion 621 needs to be increased, and the area of each of the openings 622 decreases accordingly. It is therefore difficult to allow an etchant to be readily introduced and removed through the openings 622.

In addition to the configuration described above, a semiconductor circuit may be fabricated on and above the semiconductor substrate 21. The semiconductor circuit has an active device, such as a MOS transistor, and other circuit elements formed as required, such as a capacitor, an inductor, a resistor, a diode, wiring lines (including wiring line connected to lower electrode 51, wiring line connected to upper electrode 53, and wiring layers 62 and 64). Further, although not shown, wiring lines electrically connected to the oscillation device 5 described above are so disposed between the wiring layer 62 and the insulating film 23 that the wiring lines extend in regions inside and outside the cavity S, and the wiring layer 62 is so formed that it is separate from the wiring lines.

The cavity S defined by the substrate 2 and the laminated structural body 6 functions as an accommodation portion that accommodates the oscillation device 5. The cavity S is also a closed-up space. In the present embodiment, the cavity S is maintained in a vacuum state (in which pressure is lower than or equal to 300 Pa). The oscillation device 5 is thus allowed to have an excellent oscillation characteristic. The cavity S is, however, not necessarily maintained in a vacuum state and may instead be maintained in an atmospheric state, a decompressed state in which the pressure is lower than the atmospheric pressure, or a pressurized state in which the pressure is higher than the atmospheric pressure. Further, a nitrogen gas, a rare gas, or any other inert gas maybe sealed in the cavity S.

The configuration of the electronic part 1 has been described.

In the thus configured electronic part 1, a periodically changing voltage is applied between the lower electrode 51 and the upper electrode 53 to produce bending oscillation in which the movable portion 531 is alternately displaced in the direction in which the movable portion 531 approaches the lower electrode 51 and in the direction in which the movable portion 531 moves away from the lower electrode 51. The thus operating electronic part 1 can be used as an electrostatically driven vibrator in which a periodically changing electric field is produced between the lower electrode 51 and the movable portion 531 to cause the movable portion 531 to oscillate.

The electronic part 1 can be combined, for example, with an oscillation circuit (drive circuit) and used as an oscillator from which a signal having a predetermined frequency is extracted. The oscillation circuit can be provided as a semiconductor circuit on the substrate 2. Further, the electronic part 1 can be used in a variety of sensors, such as a gyro sensor, a pressure sensor, an acceleration sensor, and an inclination sensor.

In the electronic part 1 including the oscillation device 5, which is a resonator, when the material of which the sealing layer 66 is made attaches to the oscillation device 5, an unwanted change in the characteristic of the oscillation device 5 tends to occur. In the electronic part 1 to which the invention is applied, the advantageous effect provided by the invention therefore appears in a remarkable manner. Further, in the electronic part 1 including the oscillation device 5, an unwanted change in the characteristic tends to occur also when the wiring layer 62 is bent along with the ceiling portion 641 toward the bottom portion of the cavity S and comes into contact with the oscillation device 5. Therefore, in the electronic part 1 described above, preventing the wiring layer 62 (shielding portion 621) from coming into contact with the oscillation device 5 allows the advantageous effect provided by the invention to appear in a remarkable manner.

Method for Manufacturing Electronic Part

A method for manufacturing the electronic part 1 will next be briefly described.

Figure 6A:
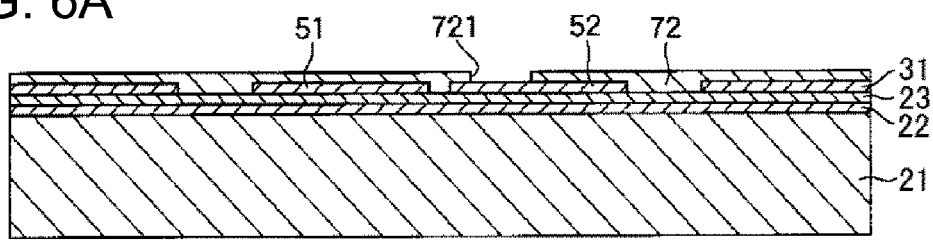
FIGS. 6A to 6C show a step of manufacturing the electronic part shown in FIG. 1 (movable electrode formation step).
Figure 6B:
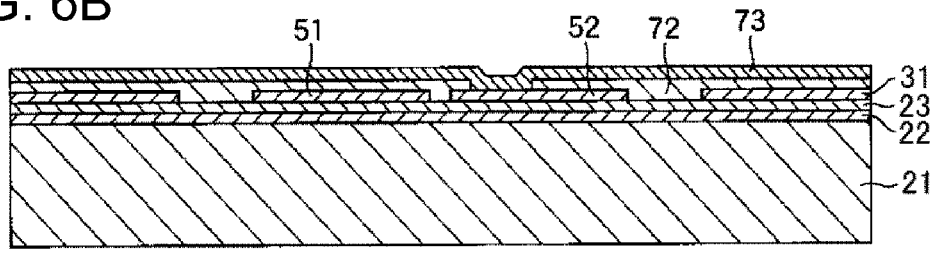
Figure 6C:
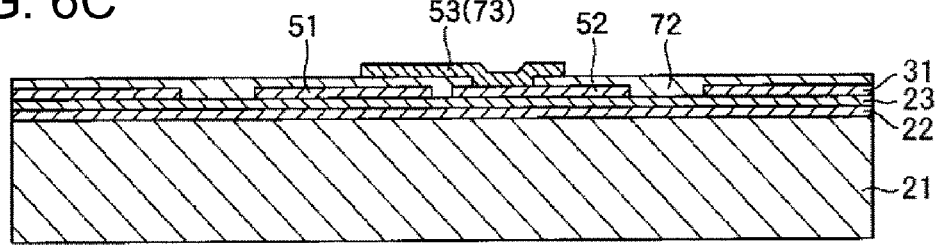
Figure 7A:
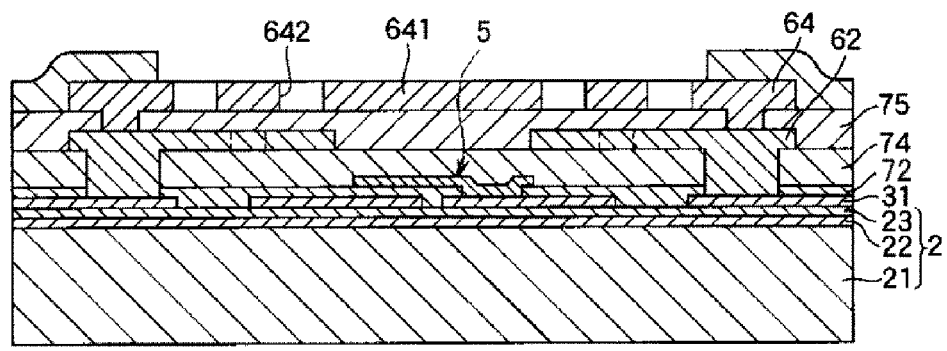
FIGS. 7A to 7C show a step of manufacturing the electronic part shown in FIG. 1 (cavity formation step).
Figure 7B:
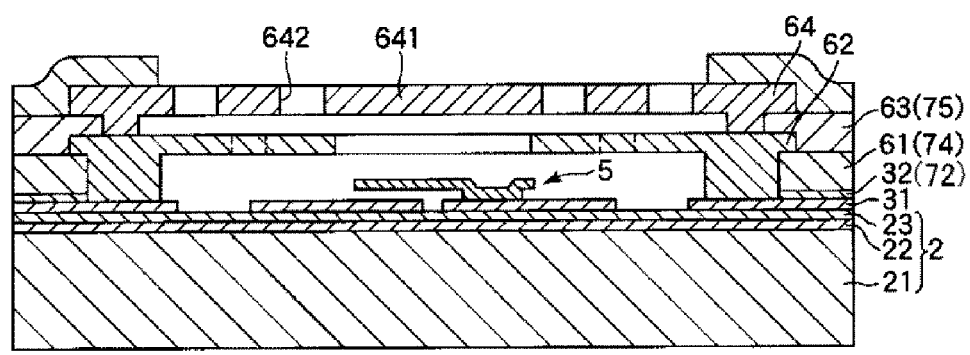
Figure 7C:
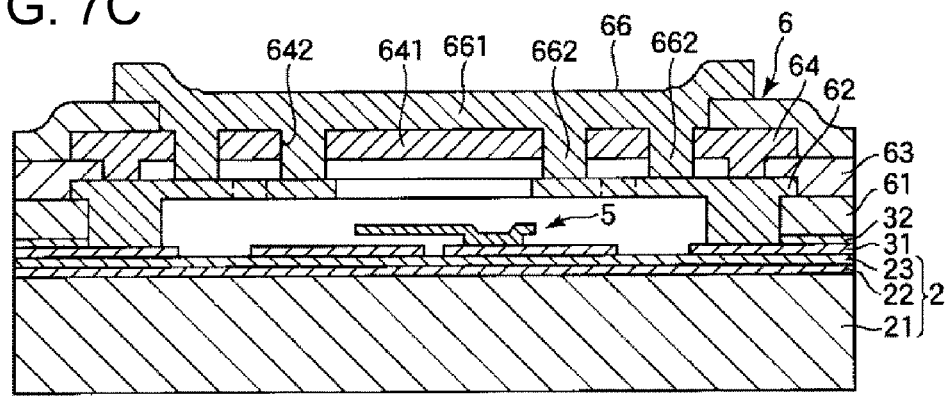

FIGS. 5A to 5E show a step of manufacturing the electronic part shown in FIG. 1 (fixed electrode formation step). FIGS. 6A to 6C show a step of manufacturing the electronic part shown in FIG. 1 (movable electrode formation step). FIGS. 7A to 7C show a step of manufacturing the electronic part shown in FIG. 1 (cavity formation step). FIGS. 8A to 8D describe the formation of the sealing layer in the cavity formation step shown in FIGS. 7A to 7C. The steps will be described below with reference to these figures.

Oscillation Device Formation Step

Step of Preparing Substrate

Figure 5A:
FIGS. 5A to 5E show a step of manufacturing the electronic part shown in FIG. 1 (fixed electrode formation step).

The semiconductor substrate 21 (silicon substrate) is first prepared, as shown in FIG. 5A.

When a semiconductor circuit is formed on and above the semiconductor substrate 21, the source and the drain of a MOS transistor in the semiconductor circuit are formed by doping ions into portions of the upper surface of the semiconductor substrate 21 where the insulating film 22 or 23 is not formed.

Figure 5B:

The insulating film 22 (silicon oxide film) is then formed on the upper surface of the semiconductor substrate 21, as shown in FIG. 5B.

A method for forming the insulating film 22 (silicon oxide film) is not limited to a specific method and can, for example, be a thermal oxidation method (including LOCOS method and STI method), a sputtering method, or a CVD method. The insulating film 22 may be patterned as required. For example, when a semiconductor circuit is formed on or above the upper surface of the semiconductor substrate 21, the insulating film 22 is so patterned that part of the upper surface of the semiconductor substrate 21 is exposed.

Figure 5C:
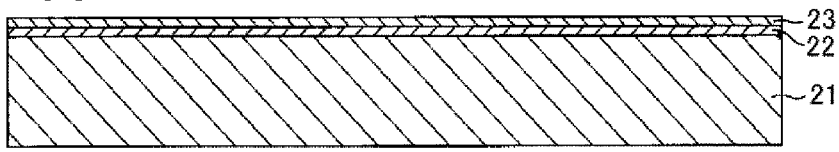

The insulating film 23 (silicon nitride film) is then formed on the insulating film 22, as shown in FIG. 5C.

A method for forming the insulating film 23 (silicon nitride film) is not limited to a specific method and can, for example, be a sputtering method or a CVD method. The insulating film 23 may be patterned as required. For example, when a semiconductor circuit is formed on or above the upper surface of the semiconductor substrate 21, the insulating film 23 is so patterned that part of the upper surface of the semiconductor substrate 21 is exposed.

Step of Forming Film for Fixed Electrode Formation

Figure 5D:
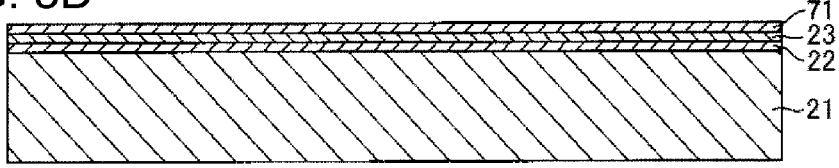

A conductor film 71 (film for fixed electrode formation) for forming the conductor layer 31 and the lower electrodes 51 and 52 is then formed on the insulating film 23, as shown in FIG. 5D.

Specifically, for example, after a silicon film made of polycrystal silicon or amorphous silicon is formed on the insulating film 23 by using a sputtering method, a CVD method, or any other method, the conductor film 71 is formed by doping phosphorus or any other impurity into the silicon film. Depending on the configuration of the insulating film 23, the conductor film 71 may instead be formed by doping phosphorus or any other impurity into an epitaxially grown silicon film.

Figure 5E:
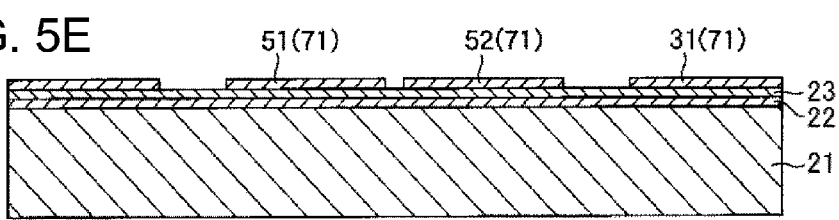

The conductor film 71 is then patterned to form the conductor layer 31 and the lower electrodes 51 and 52, as shown in FIG. 5E.

Specifically, for example, a photoresist film is formed by applying a photoresist on the conductor film 71 and patterning the photoresist to form the shapes of the conductor layer 31 and the lower electrodes 51 and 52 (shapes in plan view). The patterned photoresist film is used as a mask to etch the conductor film 71, and the photoresist film is then removed. The conductor layer 31 and the lower electrodes 51 and 52 are thus formed.

When a semiconductor circuit is formed on or above the upper surface of the semiconductor substrate 21, for example, the conductor film 71 is patterned concurrently with the patterning of the lower electrodes 51 and 52 and other portions to form the gate electrode of a MOS transistor in the semiconductor circuit.

Step of Forming Sacrifice Layer

A sacrifice layer 72 is then formed on the lower electrode 51, as shown in FIG. 6A. In the present embodiment, the sacrifice layer 72 is formed over the entire region except part of the lower electrode 52 (except portion where fixed portion 532 will be formed). An opening 721 is thus formed in the sacrifice layer 72 in correspondence with the portion where the fixed portion 532 will be formed.

In the present embodiment, the sacrifice layer 72 is a silicon oxide film. Part of the sacrifice layer 72 is removed in a step that will be described later, and the remaining portion forms the insulating film 32. When the insulating film 32 is omitted, the sacrifice layer 72 may instead be so formed that it covers only the lower electrode 51. Further, the sacrifice layer 72 may instead be made, for example, of PSG (phosphorous-doped glass).

A method for forming the sacrifice layer 72 is not limited to a specific method and can, for example, be a sputtering method or a CVD method.

Step of Forming film for Movable Electrode Formation

A conductor film 73 for forming the upper electrode 53 (film for movable electrode formation) is then formed in the opening 721 and on the sacrifice layer 72, as shown in FIG. 6B.

Specifically, for example, after a silicon film is formed in the opening 721 and on the sacrifice layer 72 by using a sputtering method, a CVD method, or any other method to deposit polycrystal silicon or amorphous silicon, phosphorus or any other impurity is doped into the silicon film to form the conductor film 73. Depending on the configuration of the sacrifice layer 72, the conductor film 73 may instead be formed by doping phosphorus or any other impurity into an epitaxially grown silicon film. Further, the silicon film may be planarized, for example, in an etching back process or a CMP (chemical mechanical polishing) process.

The conductor film 73 is then patterned to form the upper electrode 53, as shown in FIG. 6C.

Specifically, for example, a photoresist film is formed by applying a photoresist on the conductor film 73 and patterning the photoresist to form the shape of the upper electrode 53 (shape in plan view). The patterned photoresist film is used as a mask to etch the conductor film 73, and the photoresist film is then removed. The upper electrode 53 is thus formed.

The oscillation device 5 having the lower electrodes 51 and 52 and the upper electrode 53 is thus formed.

Cavity Formation Step

Interlayer insulating films 74 and 75, the wiring layers 62 and 64, and the surface protection film 65 are formed on the oscillation device 5 and the sacrifice layer 72, as shown in FIG. 7A.

Specifically, for example, a silicon oxide film is formed on the oscillation device 5 and the sacrifice layer 72 by using a sputtering method, a CVD method, or any other method, and the silicon oxide film is patterned in an etching process to form the interlayer insulating film 74 through which a through hole shaped in correspondence with the wiring layer 62 is formed. A film made of aluminum is then formed on the interlayer insulating film 74 by using a sputtering method, a CVD method, or any other method in such a way that the aluminum film fills the through hole in the interlayer insulating film 74, and the aluminum film is patterned in an etching process (unnecessary portion is removed) to form the wiring layer 62.

Thereafter, the interlayer insulating film 75 is formed in the same manner as the interlayer insulating film 74 is formed, and the wiring layer 64 is then formed in the same manner as the wiring layer 62 is formed. After the wiring layer 64 is formed, the surface protection film 65, which is, for example, a silicon oxide film, a silicon nitride film, a polyimide film, or an epoxy resin film, is formed by using a sputtering method, a CVD method, or any other method.

The laminated structure of the interlayer insulating films and the wiring layers described above is formed in a typical CMOS process, and the number of laminated layers is appropriately set as required. That is, a greater number of wiring layers are laminated via interlayer insulating films as required in some cases. Further, to form a semiconductor circuit on or above the upper surface of the semiconductor substrate 21, for example, a wiring layer electrically connected to the gate electrode and other portions of a MOS transistor in the semiconductor circuit is formed concurrently with the formation of the wiring layers 62 and 64.

Step of Etching Sacrifice Layer

Part of the sacrifice layer 72 and the interlayer insulating films 74 and 75 is then removed to form the cavity S, the insulating film 32, and the interlayer insulating films 61 and 63, as shown in FIG. 7B.

Specifically, etching is performed through the plurality of holes 642 formed in the ceiling portion 641 to remove the sacrifice layer 72 and the interlayer insulating films 74 and 75 present around the oscillation device 5 and between the lower electrode 51 and the movable portion 531. As a result, the cavity S, which accommodates the oscillation device 5, is formed, and a gap is formed between the lower electrode 51 and the movable portion 531, whereby the oscillation device 5 is ready to be driven.

Figure 8A:
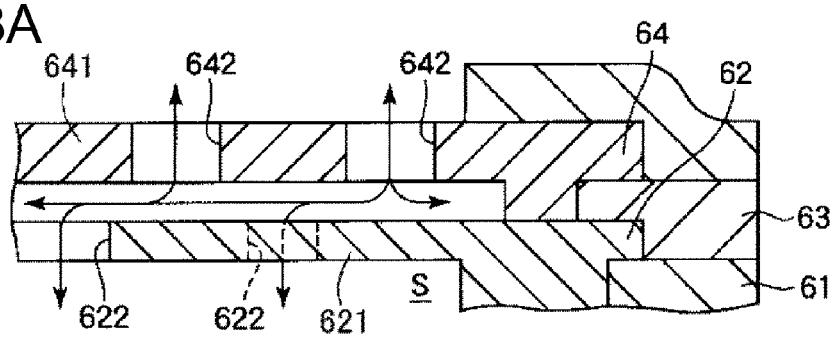
FIGS. 8A to 8D describe formation of a sealing layer in the cavity formation step shown in FIGS. 7A to 7C.

The removal of the interlayer insulating films 74 and 75 and the sacrifice layer 72 (release step) can, for example, be performed in a wet etching process of supplying hydrofluoric acid, buffer hydrofluoric acid, or any other substance as an etchant through the plurality of holes 642. In this process, the etchant caused to flow through the holes 642 flows into a portion between the ceiling portion 641 and the shielding portion 621 and through the openings 622 formed in the shielding portion 621, as shown in FIG. 8A. As a result, unnecessary portions of the interlayer insulating films 74 and 75 can be efficiently etched away. Further, a metal portion 54, the insulating film 23, and the wiring layers 62 and 64, which have resistance to the etching performed in the release step, function as what is called an etching stop layer. Before the etching, a protective film made, for example, of a photoresist may be formed as required on the outer surface of the structural body including a portion to be etched.

The sealing layer 66 is then formed on the ceiling portion 641, as shown in FIG. 7C.

Specifically, for example, the sealing layer 66, which is formed, for example, of a silicon oxide film, a silicon nitride film, a metal film made of Al, Cu, W, Ti, TiN, or any other substance, is formed by using a sputtering method, a CVD method, or any other vapor phase film deposition method to seal the holes 642.

When the sealing layer 66 is formed by using a vapor phase film deposition method, the material of which the sealing layer 66 is made is deposited not only on the ceiling portion 641 and the side surface of each of the holes 642 but also on the shielding portion 621 through the holes 642, as shown in FIGS. 8A to 8D. The speed at which the material of which the sealing layer 66 is made is deposited on the side surface of each of the holes 642 (speed at which thickness increases) is typically slower than the speed at which the material of which the sealing layer 66 is made is deposited on the ceiling portion 641 and the shielding portion 621.

Figure 8B:
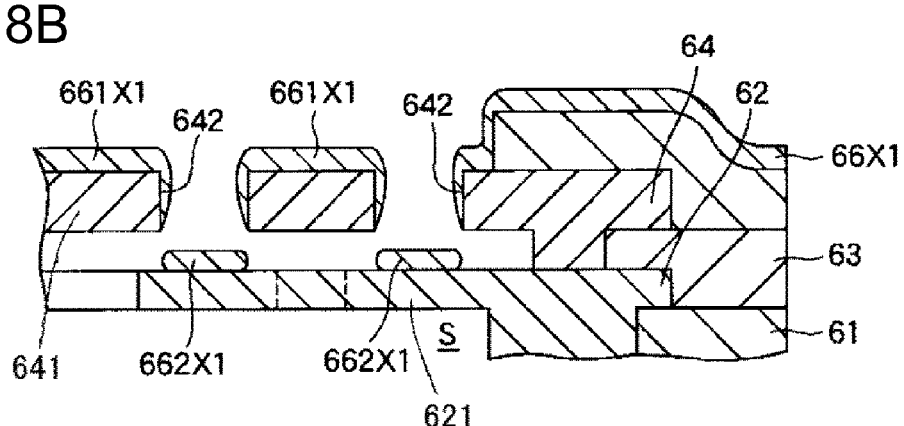
Figure 8C:
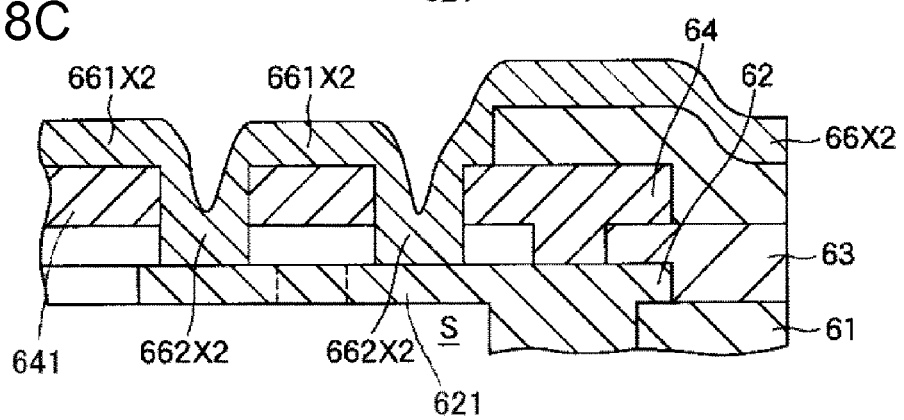
Figure 8D:
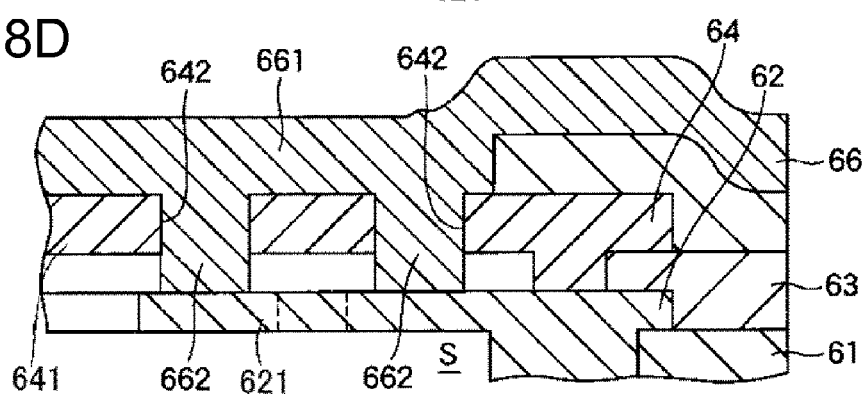

In an initial stage of the formation of the sealing layer 66, a layer 661X1 deposited on the ceiling portion 641 is so formed that the layer 661X1 and a layer 662X1 deposited on the shielding portion 621 are separate from each other, as shown in FIG. 8B. When the material of which the sealing layer 66 is made is then further deposited on the shielding portion 621 and the ceiling portion 641, a layer 661X2 deposited on the ceiling portion 641 is so formed that the layer 661X2 and a layer 662X2 deposited on the shielding portion 621 are connected to each other, as shown in FIG. 8C. In this process, before the layer deposited on the side surface of each of the holes 642 seals the hole 642, the layer deposited on the shielding portion 621 becomes thick enough to come into contact with the ceiling portion 641. As a result, the layer 661X2 connected to both the ceiling portion 641 and the shielding portion 621 via the holes 642 can be formed. The material of which the sealing layer 66 is made is still further deposited on the shielding portion 621 and the ceiling portion 641, and planarization is performed on the resultant structure as required. The sealing layer 66 is thus produced, as shown in FIG. 8D.

The electronic part 1 can be manufactured by carrying out the steps described above.

Second Embodiment

A second embodiment of the invention will next be described.

Figure 9A:
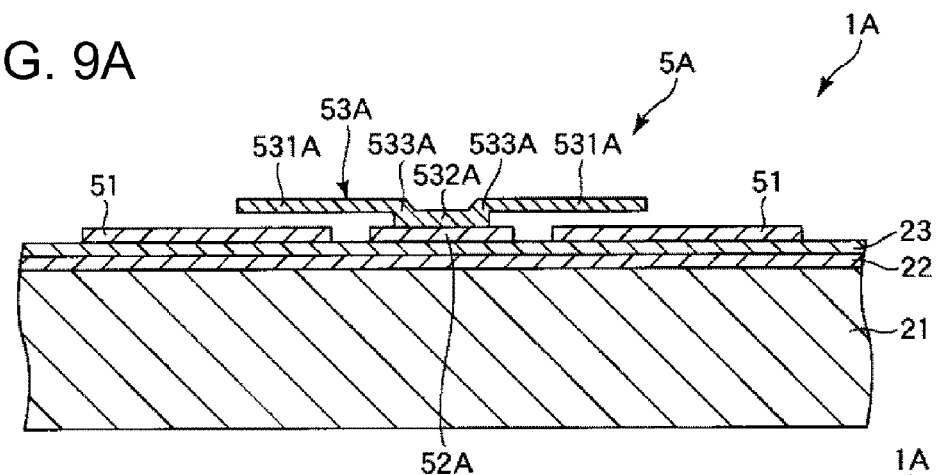
FIGS. 9A and 9B show an oscillation device (functional portion) provided in an electronic part according to a second embodiment of the invention.
Figure 9B:
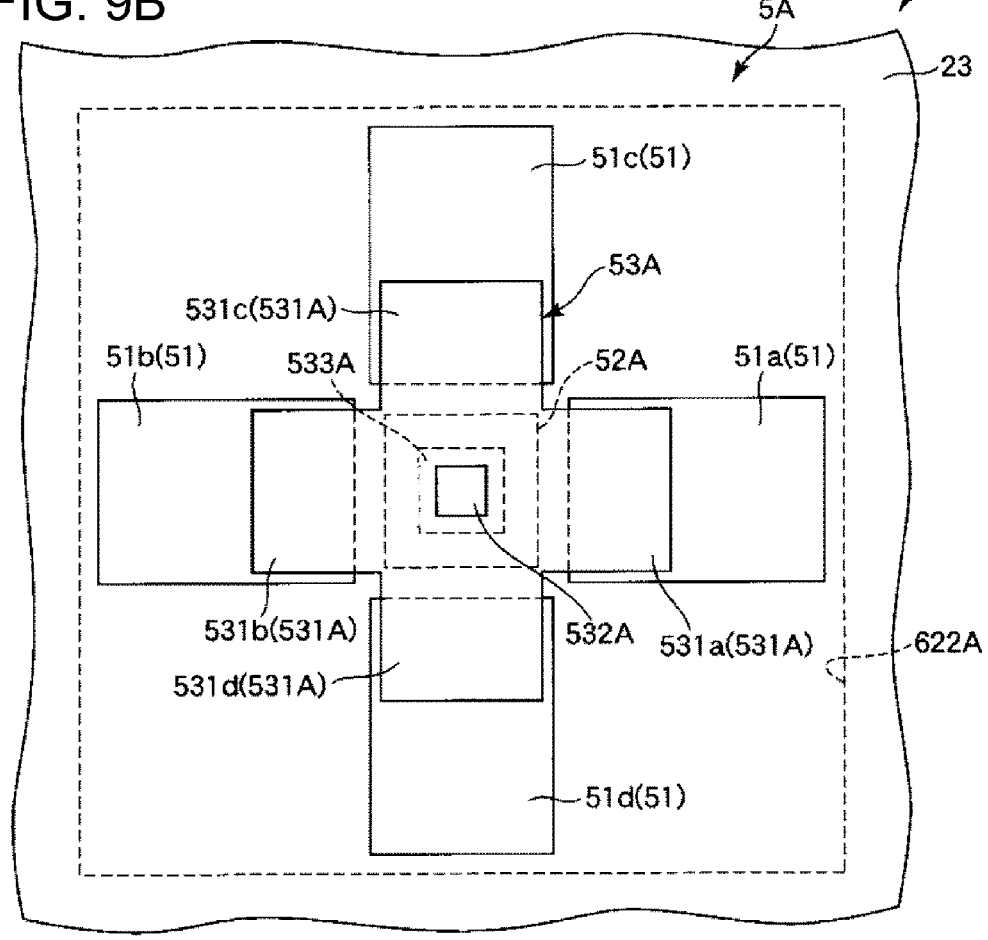

FIGS. 9A and 9B show an oscillation device (functional portion) provided in an electronic part according to a second embodiment of the invention. FIG. 9A is a cross-sectional view, and FIG. 9B is a plan view.

The second embodiment of the invention will be described below. The description will be made primarily on differences from the embodiment described above, and the same items will not be described.

The second embodiment is the same as the first embodiment described above except that the number of movable electrodes and fixed electrodes and the size of each opening in the shielding portion differ from those in the first embodiment.

An electronic part 1A shown in FIGS. 9A and 9B includes an oscillation device 5A. The oscillation device 5A has four lower electrodes 51, a lower electrode 52A, and an upper electrode 53A supported by the lower electrode 52A.

The four lower electrodes 51 (fixed electrodes) are formed of two lower electrodes 51a and 51b, which are aligned with each other along a first direction (rightward/leftward direction in FIG. 9B) in such a way that they sandwich the lower electrode 52A, and two lower electrodes 51c and 51d, which are aligned with each other along a second direction (upward/downward direction in FIG. 9B) perpendicular to the first direction in such a way that they sandwich the lower electrode 52A in the plan view. Each of the four lower electrodes 51 is so disposed that it is separate from the lower electrode 52A in the plan view.

The two lower electrodes 51a and 51b are electrically connected to each other via a wiring line that is not shown and hence have the same potential. Similarly, the two lower electrodes 51c and 51d are electrically connected to each other via a wiring line that is not shown and hence have the same potential.

The upper electrode 53A (movable electrode) has four movable portions 531A, a fixed portion 532A, which is fixed to the lower electrode 52A, and a connection portion 533A, which connects the movable portions 531A to the fixed portion 532A.

The four movable portions 531A are provided in correspondence with the four lower electrodes 51 described above, and each of the movable portions 531A faces the corresponding lower electrode 51 with a gap therebetween. That is, the four movable portions 531A are formed of two movable portions 531a and 531b, which are aligned with each other along the first direction (rightward/leftward direction in FIG. 9B) in such a way that they sandwich the fixed portion 532A, and two movable portions 531c and 531d, which are aligned with each other along the second direction (upward/downward direction in FIG. 9B) perpendicular to the first direction in such a way that they sandwich the fixed portion 532A.

The thus configured fixed portion 532A of the upper electrode 53A has a plurality of metal portions 54A disposed thereon.

In the thus configured electronic part 1A, a periodically changing first voltage (alternating voltage) is applied between the lower electrodes 51a, 51b and the upper electrode 53A, and a second voltage that is the same as the first voltage except that the phase of the second voltage is shifted from the phase of the first voltage by 180° is applied between the lower electrodes 51c, 51d and the upper electrode 53A.

Under the voltage application, the movable portions 531a and 531b undergo bending oscillation in which they are displaced alternately in the direction toward the lower electrodes 51a and 51b and the direction away therefrom, and the movable portions 531c and 531d undergo bending oscillation in which they are displaced alternately in the direction toward the lower electrodes 51c and 51d and the direction away therefrom in the reversed phase with respect to the movable portions 531a and 531b. That is, when the movable portions 531a and 531b are displaced in the direction in which they approach the lower electrodes 51*a* and 51*b*, the movable portions 531*c* and 531*d* are displaced in the direction in which they move away from the lower electrodes 51*c* and 51*d*, whereas when the movable portions 531*a* and 531*b* are displaced in the direction in which they move away from the lower electrodes 51*a* and 51*b*, the movable portions 531*c* and 531*d* are displaced in the direction in which they approach the lower electrodes 51*c* and 51*d*.

Causing the movable portions 531*a*, 531*b* and the movable portions 531*c*, 531*d* to oscillate in the reversed phase with respect to each other allows the oscillation transmitted from the movable portions 531*a*, 531*b* to the fixed portion 532A and the oscillation transmitted from the movable portions 531*c*, 531*d* to the fixed portion 532A to cancel each other. As a result, outward leakage of the two types of oscillation via the fixed portion 532A or what is called oscillation leakage can be suppressed, whereby the oscillation efficiency of the electronic part 1A can be increased. The electronic part 1A, which has a plurality of movable portions 531A, thus allows reduction in outward oscillation leakage from the movable portions 531A.

In the thus configured electronic part 1A, when the material of which a sealing layer that is not shown is made attaches to the oscillation device 5A, an unwanted change in the characteristic of the electronic part 1A tends to occur, as in the electronic part 1 described above. Further, in the electronic part 1A, when a wiring layer that is not shown is bent along with a ceiling portion and comes into contact with the oscillation device 5A, an unwanted change in the characteristic of the electronic part 1A also tends to occur. To avoid the situation, in the electronic part 1A, an opening 622A is provided in a shielding portion and in the region indicated by the broken line in FIG. 9B.

The upper electrode 53A is located inside the opening 622A in the plan view. The configuration can prevent the shielding portion from coming into contact with the upper electrode 53A. Further, the entire group formed of the four lower electrodes 51 is located inside the opening 622A in the plan view. The configuration can further prevent the shielding portion from coming into contact with the lower electrodes 51 or prevent a short circuit therebetween.

Third Embodiment

A third embodiment of the invention will next be described.

Figure 10:
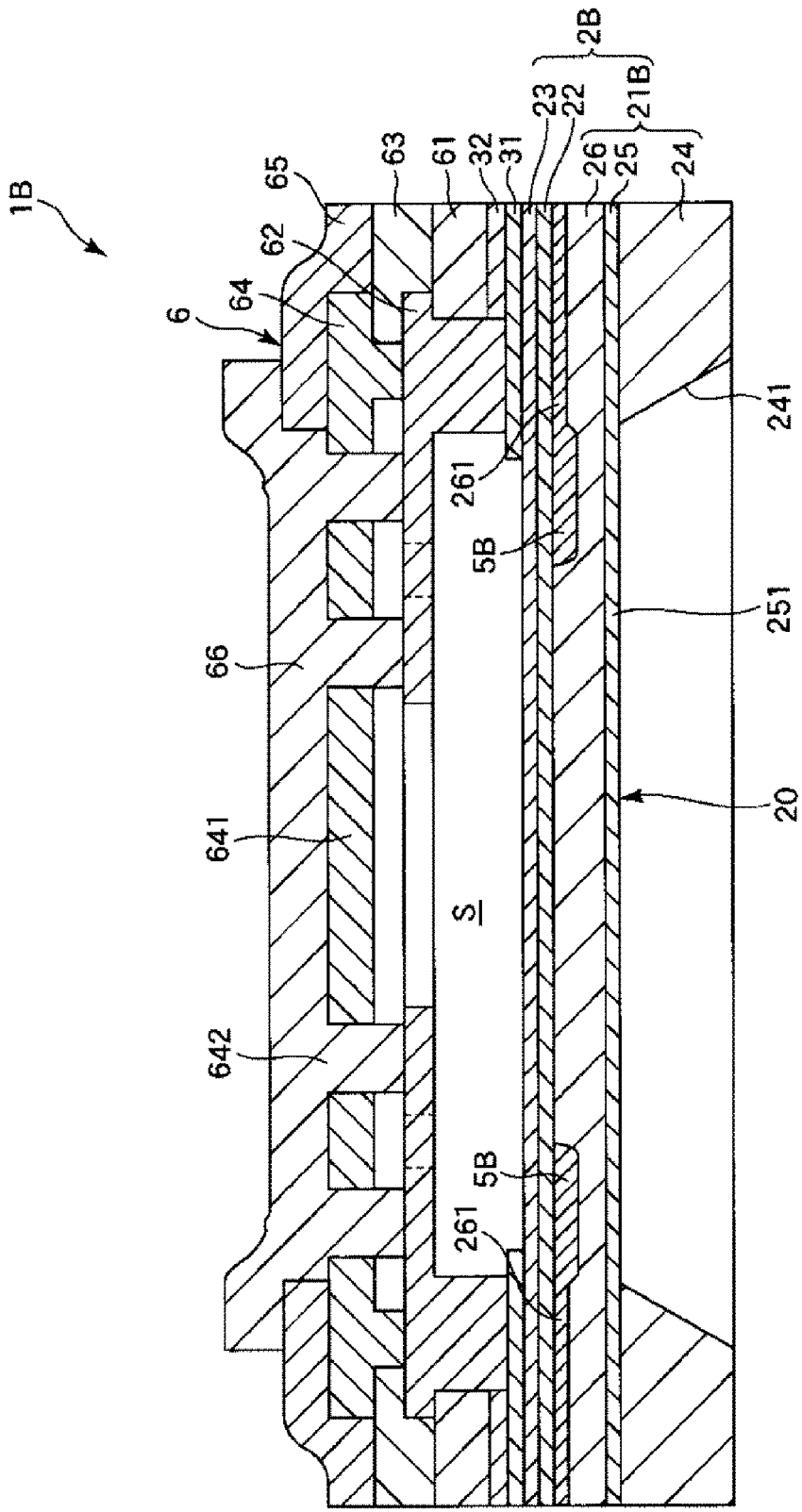
FIG. 10 is a cross-sectional view showing an electronic part according to a third embodiment of the invention.
Figure 11:
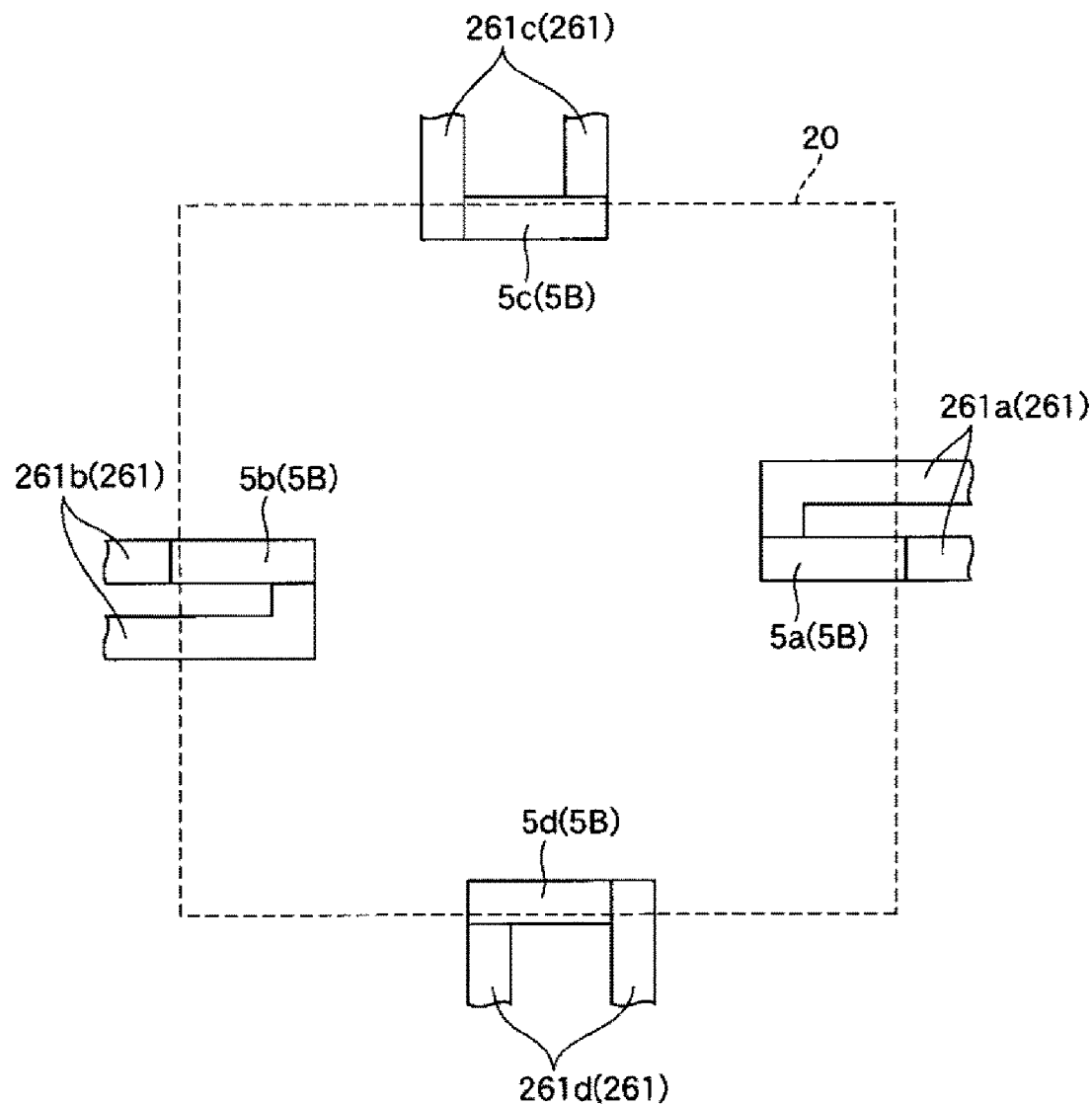
FIG. 11 is a plan view for describing a bending detection device provided in the electronic part shown in FIG. 10.
Figure 12A:
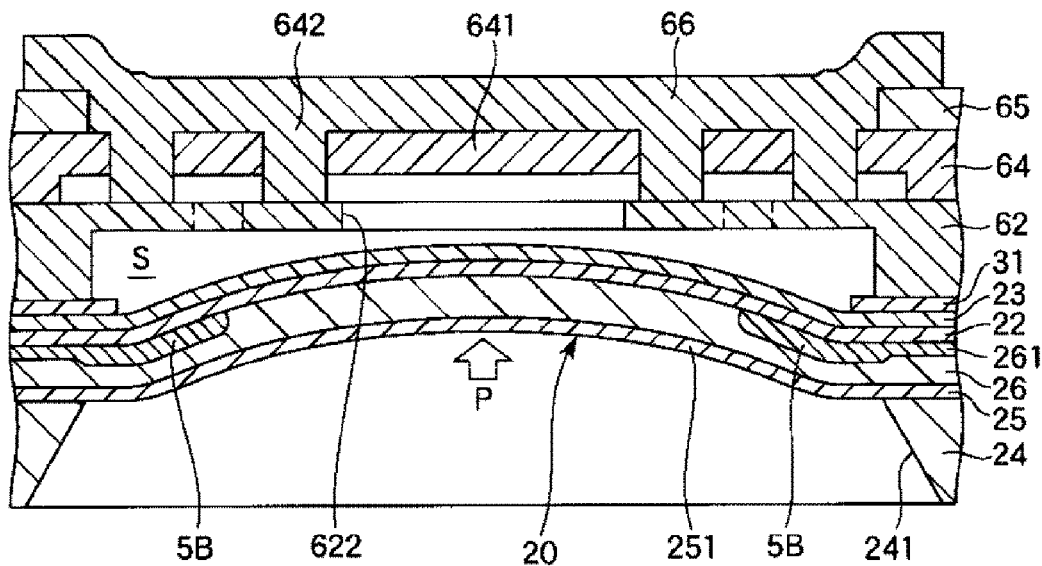
FIGS. 12A and 12B describe an advantageous effect provided by the electronic part shown in FIG. 10.
Figure 12B:
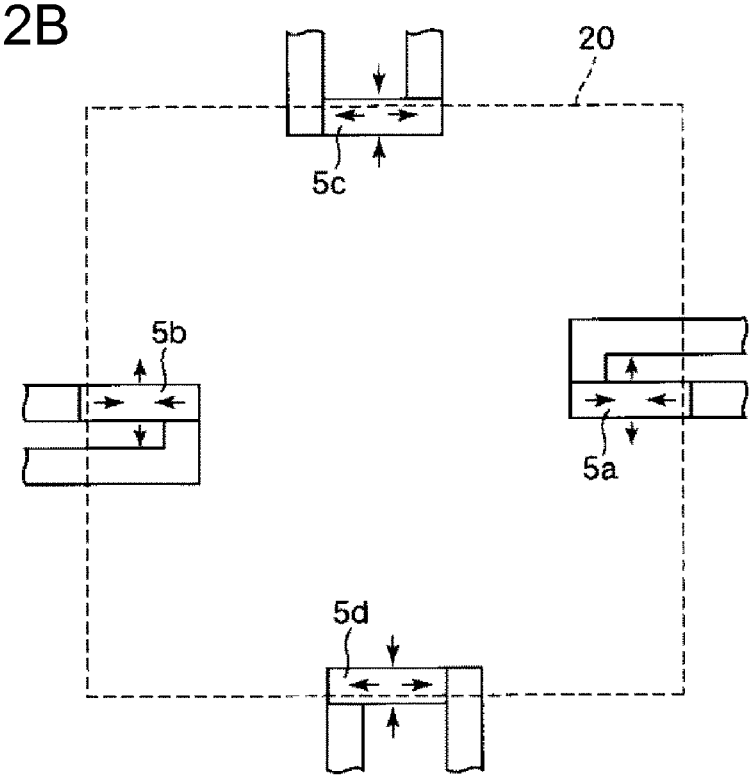

FIG. 10 is a cross-sectional view showing an electronic part according to the third embodiment of the invention. FIG. 11 is a plan view for describing a bending detection device provided in the electronic part shown in FIG. 10. FIGS. 12A and 12B describe an advantageous effect provided by the electronic part shown in FIG. 10. FIG. 12A is a cross-sectional view showing the state of a diaphragm, and FIG. 12B is a plan view showing the state of the bending detection device.

The third embodiment of the invention will be described below. The description will be made primarily on differences from the embodiments described above, and the same items will not be described.

The third embodiment is the same as the first embodiment described above except that the diaphragm is provided and piezoresistance devices, each of which is the bending detection device, are provided in place of the oscillation device.

An electronic part 1B shown in FIG. 10 is configured to be capable of detecting pressure. The electronic part 1B is similar to the electronic part 1 according to the first embodiment but differs therefrom in that the substrate 2 is replaced with a substrate 2B having piezoresistance devices 5B and a diaphragm 20. The diaphragm 20 forms the "functional portion."

The substrate 2B has an SOI substrate 21B, an insulating film 22, which is provided on one surface of the SOI substrate 21B, and an insulating film 23, which is provided on the insulating film 22.

The SOI substrate 21B has the following layers stacked on each other in the following order: a silicon layer 24 (handle layer) made of single crystal silicon; a silicon oxide layer 25 (box layer) formed of a silicon oxide film; and a silicon layer 26 (device layer) made of single crystal silicon.

The diaphragm 20, which is thinner than the portion around the diaphragm 20 and undergoes bending deformation under pressure, is provided on the substrate 2B. The diaphragm 20 is formed by providing a bottomed recess 241 that is located on the lower side of the SOI substrate 21B and passes through the silicon layer 24. In the thus formed diaphragm 20, the bottom surface of the recess 241 (silicon oxide layer 25) serves as a pressure receiving surface 251. The recess 241 can be formed in an etching process.

The diaphragm 20 of the substrate 2B in the present embodiment has a four-layer configuration having the silicon oxide layer 25 and the silicon layer 26 of the SOI substrate 21B, the insulating film 22, and the insulating film 23. The recess 241 may instead not pass through the silicon layer 24.

The plurality of piezoresistance devices 5B are provided on the opposite side (side facing cavity S) of the silicon layer 26 of the diaphragm 20 to the pressure receiving surface 251.

The plurality of piezoresistance devices 5B are formed of a plurality of piezoresistance devices 5*a*, 5*b*, 5*c*, and 5*d* disposed in an outer circumferential portion of the diaphragm 20, as shown in FIG. 11.

The piezoresistance devices 5*a*, 5*b*, 5*c*, and 5*d* are disposed in correspondence with the four sides of the diaphragm 20, which has a rectangular shape in the plan view.

The piezoresistance device 5*a* extends along the direction perpendicular to the corresponding side of the diaphragm 20. A pair of wiring lines 261*a* are electrically connected to both ends of the piezoresistance device 5*a*. Similarly, the piezoresistance device 5*b* extends along the direction perpendicular to the corresponding side of the diaphragm 20. A pair of wiring lines 261*b* are electrically connected to both ends of the piezoresistance device 5*b*.

On the other hand, the piezoresistance device 5*c* extends along the direction parallel to the corresponding side of the diaphragm 20. A pair of wiring lines 261*c* are electrically connected to both ends of the piezoresistance device 5*c*. Similarly, the piezoresistance device 5*d* extends along the direction parallel to the corresponding side of the diaphragm 20. A pair of wiring lines 261*d* are electrically connected to both ends of the piezoresistance device 5*d*.

In the following description, the wiring lines 261*a*, 261*b*, 261*c*, and 261*d* are also collectively referred to as "wiring lines 261."

Each of the piezoresistance devices 5B and the wiring lines 261 is made, for example, of silicon (single crystal silicon) into which phosphorous, boron, or any other impurity is doped (diffused or implanted). The concentration at which the impurity is doped into the wiring lines 261 is higher than the concentration at which the impurity is doped into the piezoresistance devices 5B. The wiring lines 261 may instead be made of a metal.

The plurality of piezoresistance devices 5B are so configured that the resistance values thereof in a natural state are equal to each other.

The piezoresistance devices 5B described above, along with the wiring lines 261 and other components, form a bridge circuit (Wheatstone bridge circuit). A drive circuit (not shown) that supplies a drive voltage is connected to the bridge circuit. The bridge circuit outputs a signal (voltage) according to the resistance values of the piezoresistance devices 5B.

In the electronic part 1B described above, the cavity S functions as a pressure reference chamber that provides a reference value of the pressure detected by the electronic part 1B. Maintaining the cavity S in a vacuum state allows the electronic part 1B to be used as an "absolute pressure sensor" that detects pressure with reference to the vacuum state, whereby the electronic part 1B provides improved convenience.

In the thus configured electronic part 1B, when pressure P is applied to the pressure receiving surface 251, the diaphragm 20 undergoes bending deformation toward the cavity S, as shown in FIG. 12A. In response to the deformation, the piezoresistance devices 5a, 5b, 5c, and 5d are distorted, as shown in FIG. 12B, and the resistance values of the piezoresistance devices 5a, 5b, 5c, and 5d change. The output from the bridge circuit, which is formed of the piezoresistance devices 5a, 5b, 5c, and 5d, therefore changes, and the magnitude of pressure received by the pressure receiving surface 251 can be determined based on the output.

In the electronic part 1B used as a pressure sensor as described above, when the material of which the sealing layer 66 is made attaches to the diaphragm 20 and the piezoresistance devices 5B, an unwanted change in the characteristic of the electronic part 1B tends to occur. Therefore, when the invention is applied to such a pressure sensor, the advantageous effect provided by the invention appears in a remarkable manner. Further, in the electronic part 1B, when the shielding layer is bent along with the ceiling portion toward the bottom portion of the cavity S and comes into contact with the diaphragm 20, an unwanted change in the characteristic also tends to occur. Therefore, in such a pressure sensor, preventing the shielding layer (shielding portion) from coming into contact with the diaphragm 20 allows the advantageous effect to appear in a remarkable manner.

2. Electronic Apparatus

An electronic apparatus in which the electronic part according to any of the embodiments of the invention is used (electronic apparatus according to an embodiment of the invention) will next be described in detail with reference to FIGS. 13 to 15.

Figure 13:
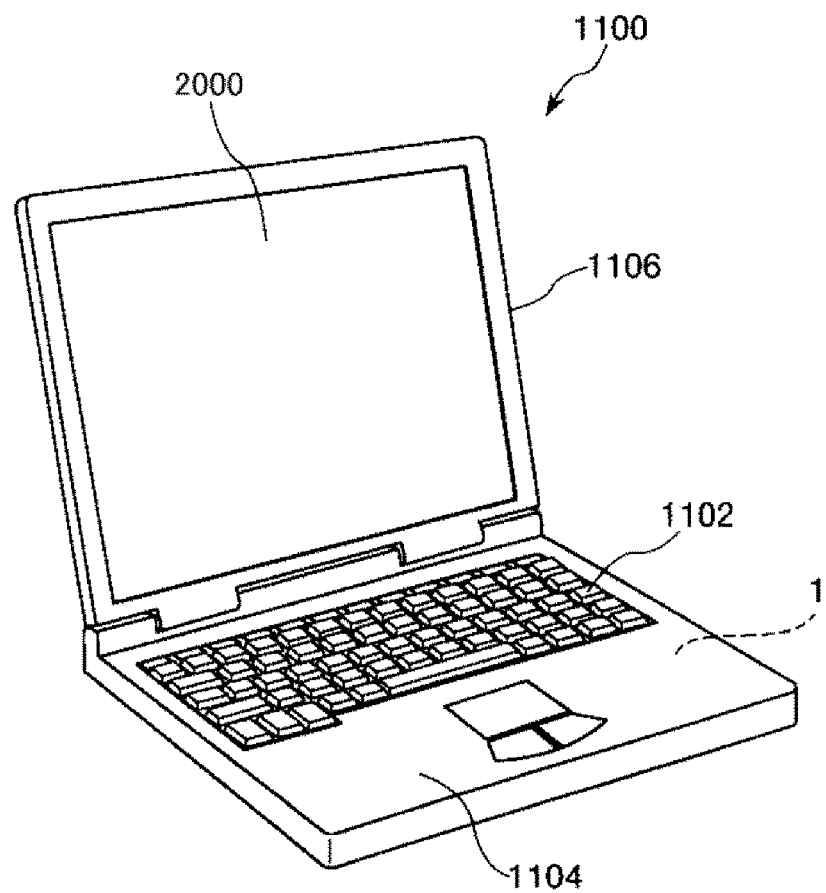
FIG. 13 is a perspective view showing the configuration of a mobile (or notebook) personal computer that is an electronic apparatus according to a first example of the invention.

FIG. 13 is a perspective view showing the configuration of a mobile (or notebook) personal computer that is the electronic apparatus according to a first example of the invention. In FIG. 13, a personal computer 1100 is formed of a body 1104 including a keyboard 1102 and a display unit 1106 including a display section 2000, and the display unit 1106 is pivotally supported by the body 1104 via a hinge structure. The thus configured personal computer 1100 accommodates the electronic part 1 (oscillator).

Figure 14:
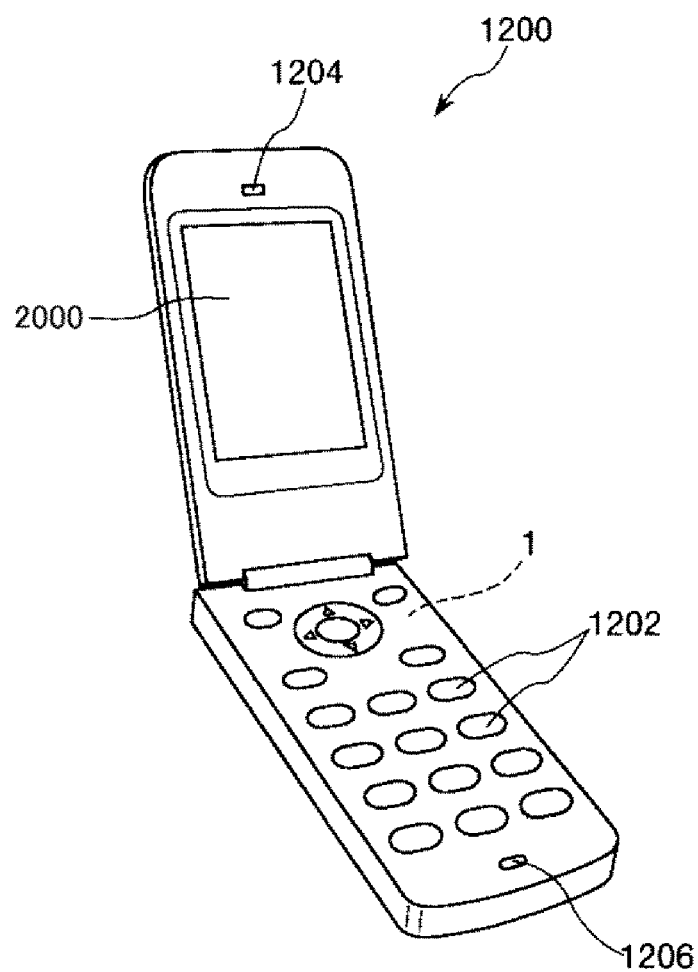
FIG. 14 is a perspective view showing the configuration of a mobile phone (including PHS) that is an electronic apparatus according to a second example of the invention.

FIG. 14 is a perspective view showing the configuration of a mobile phone (including PHS) that is the electronic apparatus according to a second example of the invention. In FIG. 14, a mobile phone 1200 includes a plurality of operation buttons 1202, a receiver 1204, and a transmitter 1206, and a display section 2000 is disposed between the operation buttons 1202 and the receiver 1204. The thus configured mobile phone 1200 accommodates the electronic part 1 (oscillator).

Figure 15:
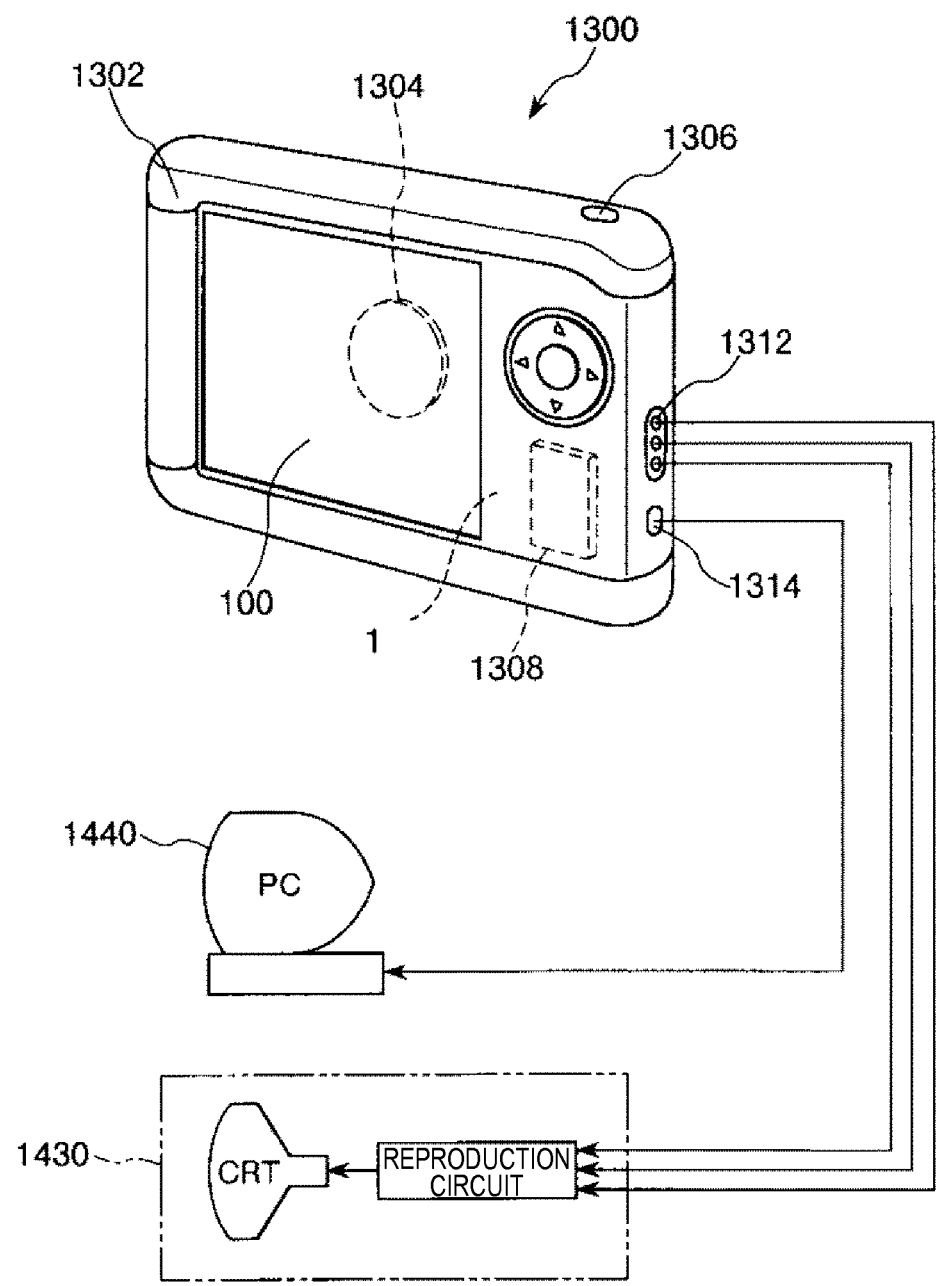
FIG. 15 is a perspective view showing the configuration of a digital still camera that is an electronic apparatus according to a third example of the invention.

FIG. 15 is a perspective view showing the configuration of a digital still camera that is the electronic apparatus according to a third example of the invention. FIG. 15 also shows connection to an external apparatus in a simplified manner. In a typical camera, a silver photographic film is exposed to light, specifically to an optical image of a subject, whereas a digital still camera 1300 converts an optical image of a subject into a captured image signal (image signal) in a photoelectric conversion process by using a CCD (charge coupled device) or any other imaging device.

A display section 100 is provided on the rear side of a case (body) 1302 of the digital still camera 1300 and displays an image based on the captured image signal from the CCD. The display section 100 thus functions as a finder that displays a subject in the form of an electronic image. Further, alight receiving unit 1304 including an optical lens (imaging system), the CCD, and other components is provided on the front side (rear side in FIG. 15) of the case 1302.

When a user of the camera checks a subject image displayed on the display section 100 and presses a shutter button 1306, a captured image signal from the CCD at that point of time is transferred to and stored in a memory 1308. Further, in the digital still camera 1300, a video signal output terminal 1312 and a data communication input/output terminal 1314 are provided on a side surface of the case 1302. A television monitor 1430 is connected to the video signal output terminal 1312 as necessary, and a personal computer 1440 is connected to the data communication input/output terminal 1314 as necessary, as shown in FIG. 15. Further, in response to predetermined operation, a captured image signal stored in the memory 1308 is outputted to the television monitor 1430 or the personal computer 1440. The thus configured digital still camera 1300 accommodates the electronic part 1 (oscillator).

The electronic apparatus described above have excellent reliability.

The electronic apparatus including the electronic part according to any of the embodiments of the invention may include not only the personal computer (mobile personal computer) shown in FIG. 13, the mobile phone shown in FIG. 14, and the digital still camera shown in FIG. 15 but also, for example, an inkjet-type liquid ejection apparatus (inkjet printer, for example), a laptop personal computer, a television receiver, a video camcorder, a video tape recorder, a car navigator, a pager, an electronic notepad (including electronic notepad having communication capability), an electronic dictionary, a desktop calculator, an electronic game console, a word processor, a workstation, a TV phone, a security television monitor, electronic binoculars, a POS terminal, medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, airplanes, and ships), and a flight simulator.

3. Moving Object

Figure 16:
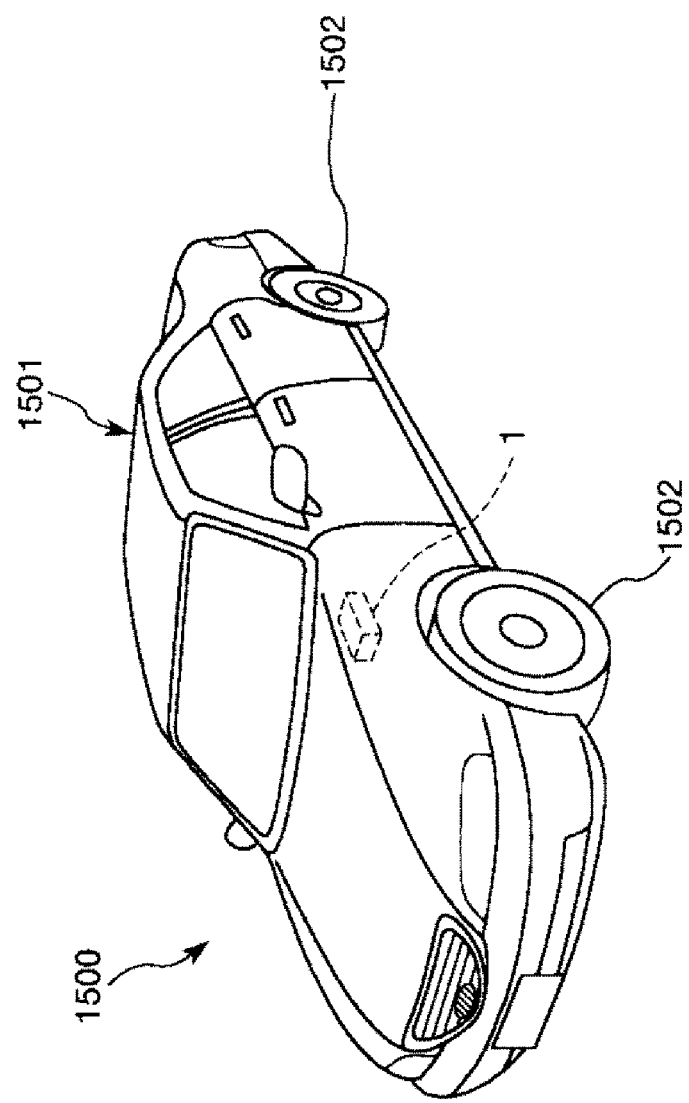
FIG. 16 is a perspective view showing the configuration of an automobile that is a moving object according to an example of the invention.

FIG. 16 is a perspective view showing the configuration of an automobile that is a moving object according to an example of the invention.

In FIG. 16, a moving object 1500 includes a vehicle body 1501 and four wheels 1502, and a power source (engine) that is not shown but is provided in the vehicle body 1501 rotates the wheels 1502. The thus configured moving object 1500 accommodates the electronic part 1 (oscillator).

The moving object described above has excellent reliability. The moving object according to the example of the invention is not limited to an automobile and can, for example, be an airplane, a ship, a motorcycle, and a variety of other moving objects.

The electronic parts, the electronic apparatus, and the moving object according to the embodiments of the invention have been described above with reference to the drawings, but the invention is not limited thereto. The configuration of each portion in the embodiments can be replaced with an arbitrary configuration having the same function as that in the embodiments, and another arbitrary configuration may be added.

The functional portion is not limited to the configurations described in the drawings of the embodiments described above. For example, the movable portion may be fixed at both ends thereof. Further, the embodiments described above have been described with reference to the case where the fixed electrodes and the movable electrode are formed in a film deposition process, but the electrodes are not necessarily formed in a film deposition process. For example, the fixed electrodes or the movable electrode may be formed by etching a substrate. Further, the functional portion is not limited to an oscillation device or a diaphragm and may instead be a variety of parts and a variety of devices provided at the bottom portion of a closed-up cavity.

The shape, arrangement, and size of the openings in the shielding portion and the holes in the ceiling portion are not limited to those in the embodiments described above. For example, the holds 642a or the holes 642b in the ceiling portion 641 shown in FIG. 3A may be omitted, or the openings 622a or the opening 622b in the shielding portion 621 shown in FIG. 3B may be omitted. Further, each of the holes 642 and the openings 622 may have a portion having a different width or a portion having a width that continuously or intermittently changes.

The entire disclosure of Japanese Patent Application No. 2014-114341, filed Jun. 2, 2014 is expressly incorporated by reference herein.

What is claimed is:

1. An electronic part comprising:
a bottom portion that has a functional portion;
a ceiling portion that is disposed in a position separate from the bottom portion via a cavity and has holes;
a shielding portion that is disposed between the bottom portion and the ceiling portion in the cavity and covers the holes in a plan view viewed in a direction in which the bottom portion and the ceiling portion are arranged; and
sealing portions that are connected to both the ceiling portion and the shielding portion and seal the holes.

2. The electronic part according to claim 1, further comprising a shielding layer having the shielding portion and openings,
wherein the openings are disposed in positions shifted from the holes in the plan view.

3. The electronic part according to claim 2, wherein the ratio of the area occupied by all the openings to the area of the shielding layer in the cavity in the plan view is greater than or equal to 20% but smaller than or equal to 80%.

4. The electronic part according to claim 2, wherein the openings include an opening that coincides with a central portion of the bottom portion in the plan view.

5. The electronic part according to claim 4, wherein the ratio of the area occupied by the opening that coincides with the central portion to the area of the shielding layer in the cavity in the plan view is greater than or equal to 10but smaller than or equal to 40%.

6. The electronic part according to claim 1, wherein the functional portion includes
a diaphragm that undergoes bending deformation under pressure, and
a bending detection device that outputs a signal according to the bending deformation of the diaphragm.

7. The electronic part according to claim 1, wherein the functional portion includes a resonator.

8. The electronic part according to claim 1, wherein the distance between the shielding portion and the ceiling portion is smaller than the distance between the shielding portion and the bottom portion.

9. The electronic part according to claim 1, wherein the distance between the shielding portion and the ceiling portion is greater than the distance between the shielding portion and the bottom portion.

10. The electronic part according to claim 1, further comprising a sealing layer having the sealing portions,
wherein the thickness of the sealing layer is greater than or equal to the distance between the shielding portion and the ceiling portion.

11. The electronic part according to claim 1, wherein the distance between the shielding portion and the ceiling portion falls within a range greater than or equal to 1 µm but smaller than or equal to 5 µm.

12. An electronic apparatus comprising the electronic part according to claim 1.

13. A moving object comprising the electronic part according to claim 1.

* * * * *